United States Patent
Maegawa et al.

(10) Patent No.: US 8,415,188 B2
(45) Date of Patent: Apr. 9, 2013

(54) METHOD FOR MANUFACTURING NITRIDE SEMICONDUCTOR LASER ELEMENT

(75) Inventors: Hitoshi Maegawa, Anan (JP);
Mitsuhiro Nonaka, Tokushima (JP);
Yasunobu Sugimoto, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/225,935

(22) Filed: Sep. 6, 2011

(65) Prior Publication Data
US 2012/0058585 A1  Mar. 8, 2012

(30) Foreign Application Priority Data
Sep. 8, 2010  (JP) .................................. 2010-201087

(51) Int. Cl.
*H01L 33/26* (2010.01)

(52) U.S. Cl. .................................. 438/46; 257/E33.013

(58) Field of Classification Search .................. None
See application file for complete search history.

(56) References Cited

U.S. PATENT DOCUMENTS

| 2007/0086497 A1 | 4/2007 | Tanaka et al. |
| 2007/0217461 A1 | 9/2007 | Masui |

FOREIGN PATENT DOCUMENTS

| JP | 2004-111689 A | 4/2004 |
| JP | 2006-024703 A | 1/2006 |
| JP | 2007-103403 A | 4/2007 |
| JP | 2007-109886 A | 4/2007 |
| JP | 2007-165448 A | 6/2007 |
| JP | 2007-288149 A | 11/2007 |

*Primary Examiner* — Seahvosh Nikmanesh
(74) *Attorney, Agent, or Firm* — Global IP Counselors, LLP

(57) ABSTRACT

A method for manufacturing a nitride semiconductor laser element has: (a) forming a nitride semiconductor layer on a substrate; (b) forming a ridge on a surface of the nitride semiconductor; (c) forming a first protective film on the nitride semiconductor layer including the ridge; (d) removing the first protective film from at least a top face of the ridge; (e) forming a conductive layer composed of a two or more of multilayer film with different compositions on the first protective film and the nitride semiconductor layer including the ridge, and introducing a gap at locations of at least at the uppermost conductive layer corresponding to the base portion from the ridge shoulders; and (f) removing part of the conductive layer through a gap to form a void defined by the first protective film and the conductive layer at least on the ridge base portions.

8 Claims, 10 Drawing Sheets

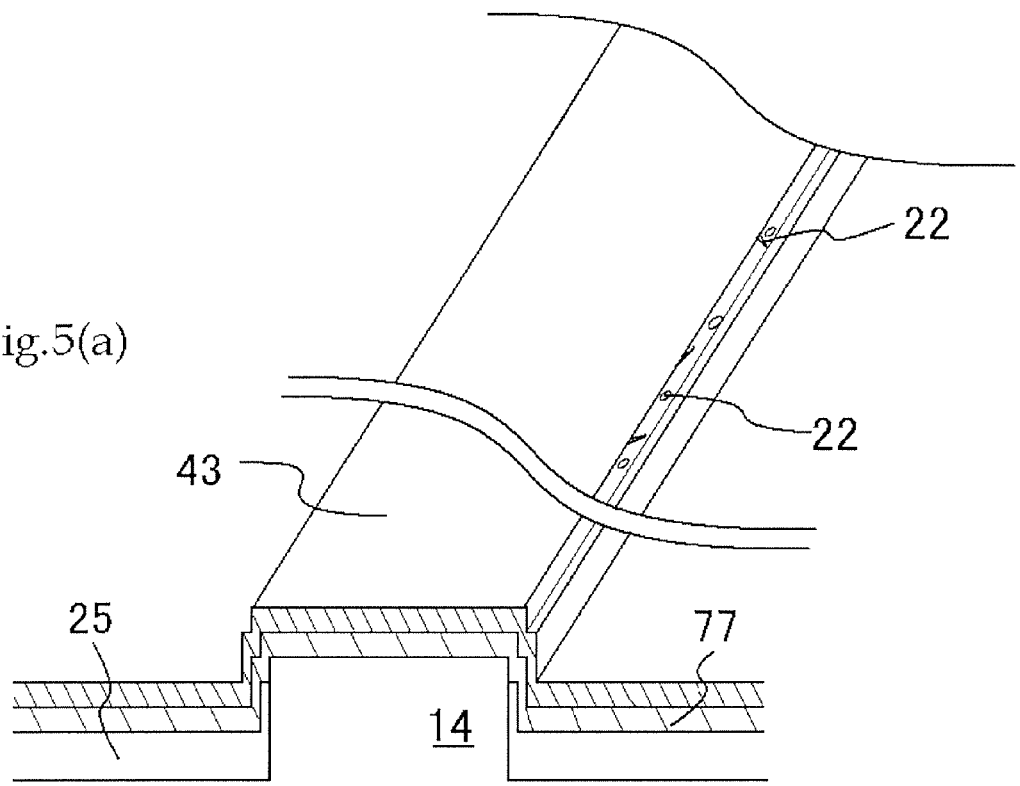
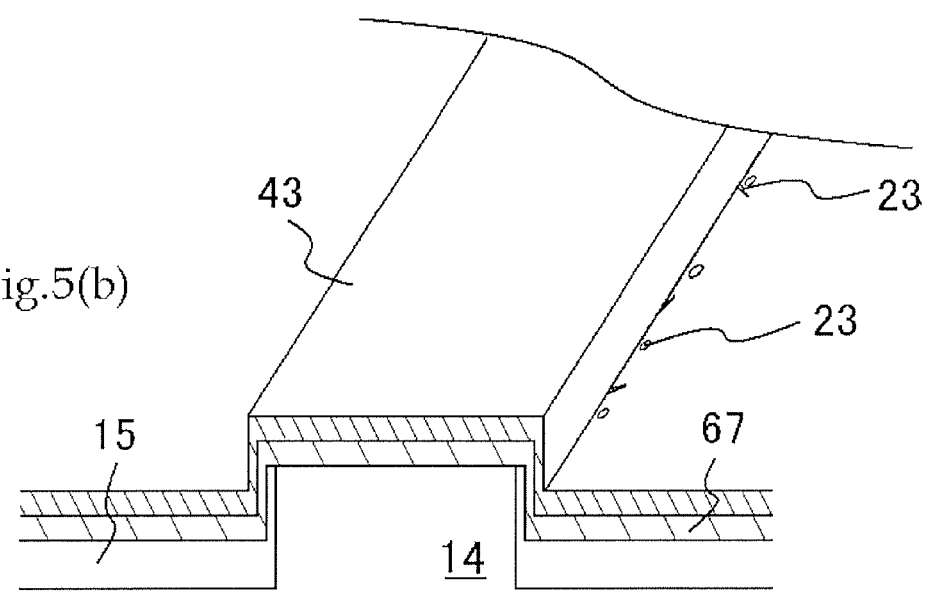

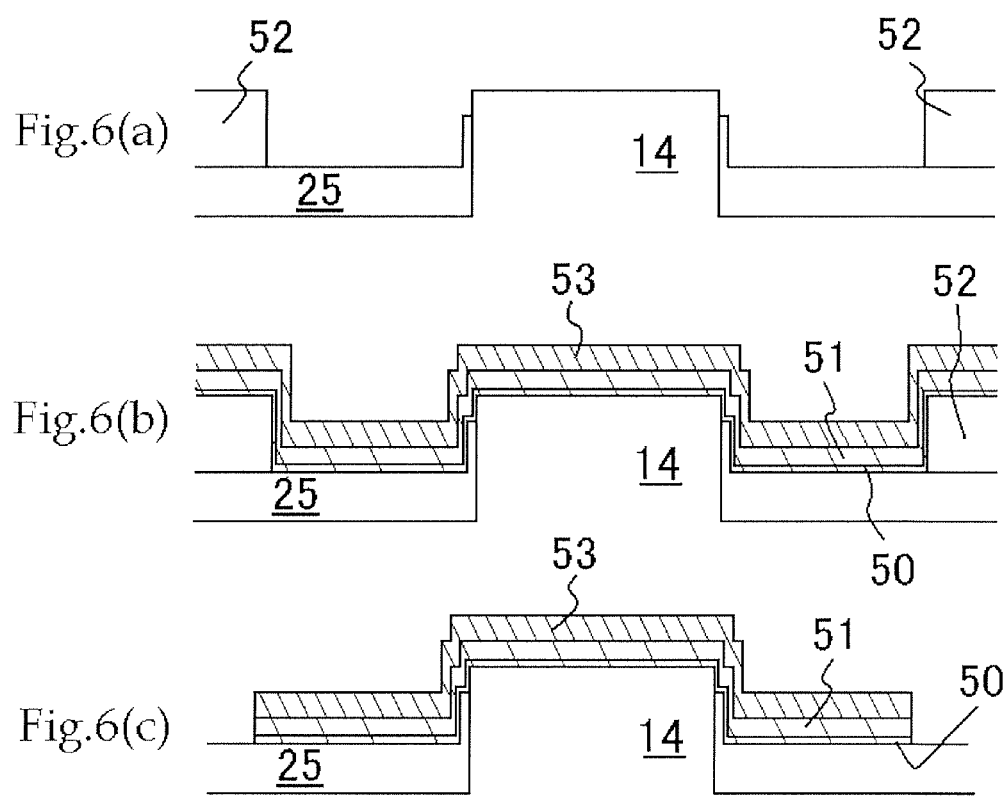

US 8,415,188 B2

METHOD FOR MANUFACTURING NITRIDE SEMICONDUCTOR LASER ELEMENT

CROSS-REFERENCE TO RELATED APPLICATIONS

This application claims priority to Japanese Application No. 2010-201087 filed in Japan on Sep. 8, 2010. The entire disclosures of Japanese Application No. 2010-201087 is incorporated hereinto by reference.

BACKGROUND

1. Technical Field

The present invention relates to a method for manufacturing a nitride semiconductor laser element, and more particularly relates to a method for manufacturing a nitride semiconductor laser element having a ridge waveguide structure.

2. Related Art

Nitride semiconductors are formed from compound semiconductors such as $In_xAl_yGa_{1-x-y}N$ ($0 \leq x$, $0 \leq y$, $0 \leq x+y \leq 1$), and the semiconductor laser elements in which these are used are needed in a growing list of applications, such as in optical disk systems capable of recording and reproducing large volumes or high-density information, such as next-generation DVD's, in personal computers and other such electronic devices, and in optical networks. Accordingly, a variety of structures have been proposed for laser elements in order to allow favorable control of lateral mode, to lower power consumption, to increase output, to improve reliability, to reduce size, to lengthen the service life, and so forth.

In particular, with a laser element featuring a ridge waveguide structure, a structure has been studied in which an electrode is brought into contact with the ridge top face, and a protective film with a low refractive index is used as an embedded film that goes from the ridge side face to both sides, in order to improve controllability and reproducibility of optical confinement in lateral mode and to stabilize the horizontal-lateral mode.

For example, a semiconductor laser has been proposed in which an embedded layer composed of a dielectric film is formed on both sides of a ridge, and an electrode is formed in contact with the ridge top face and on the semiconductor layer surface on both sides of the ridge from the ridge side walls, via an embedded film (see JP-2004-111689-A).

A method has also been proposed for stabilizing the horizontal-layer mode by introducing a void into an electrode disposed to the side of the ridge (see JP-2007-109886-A).

However, as laser elements have become smaller in recent years, the ridge width has shrunken, and if the electrode is only brought in contact with the ridge top face, this reduces adhesion of the electrode to the semiconductor layer, which is a problem in that voltage tends to deteriorate during continuous drive.

Also, when an electrode that is in contact with the ridge top face is disposed on the surface of a nitride semiconductor layer on both sides of the ridge via an embedded film, with some electrode materials there is greater stress on the semiconductor layer, and current tends to deteriorate during continuous drive, and depending on the film quality of the electrode formed on the ridge side face, optical absorption may increase.

SUMMARY

The present invention was conceived in light of the above situation, and is an object thereof to provide a method for manufacturing a nitride semiconductor laser element with which the optical confinement of the nitride semiconductor laser element can be controlled while deterioration of current or voltage during continuous drive can be prevented.

A method for manufacturing a nitride semiconductor laser element of the present invention has: (a) forming a nitride semiconductor layer on a substrate; (b) forming a ridge on a surface of the nitride semiconductor; (c) forming a first protective film on the nitride semiconductor layer including the ridge; (d) removing the first protective film from at least a top face of the ridge; (e) forming a conductive layer composed of a two or more of multilayer film with different compositions on the first protective film and the nitride semiconductor layer including the ridge, and introducing a gap at locations of at least at the uppermost conductive layer corresponding to the base portion from the ridge shoulders; and (f) removing part of the conductive layer through a gap to form a void defined the first protective film and the conductive layer at least on the ridge base portions.

BRIEF DESCRIPTION OF THE DRAWINGS

Referring now to the attached drawings which form a part of this original disclosure:

FIG. 5 is a schematic longitudinal section view (a) and (b) describing a manufacturing method of a nitride semiconductor laser element as a comparison.

FIG. 6 is a schematic cross-sectional view describing a manufacturing method of another nitride semiconductor laser element of the present invention.

DETAILED DESCRIPTION OF EXEMPLARY EMBODIMENTS

The nitride semiconductor laser element manufactured by the present invention is mainly constituted by a substrate, a nitride semiconductor layer, a first protective film, and an electrode.

Figure 1A:
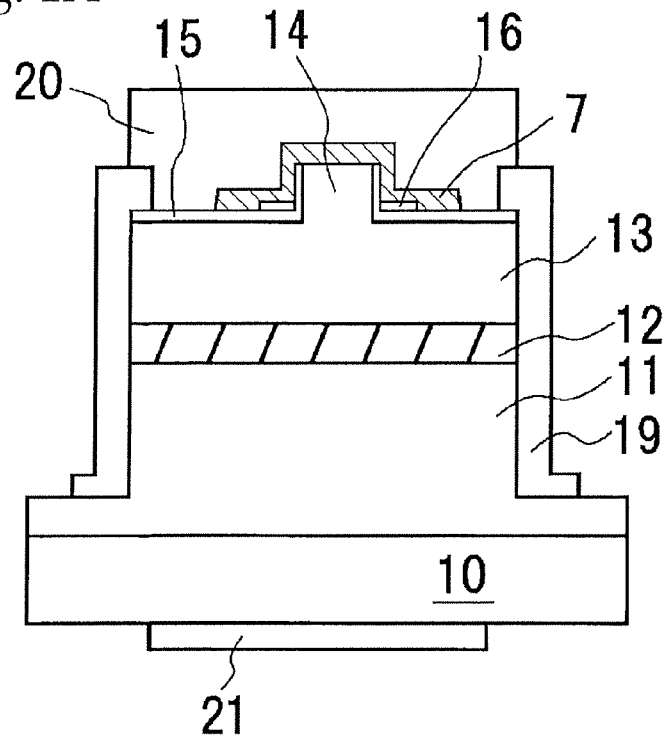
FIG. 1A is a schematic cross-sectional view describing a structure of a nitride semiconductor laser element manufactured by the present invention.

For example, as shown in FIG. 1A, an n-side semiconductor layer 11, an active layer 12, and a p-side semiconductor layer 13 are formed in that order as nitride semiconductor layers on a first main face of a substrate 10 having the first main face and a second main face. The n-side and p-side semiconductor layers may instead be disposed in reverse order. A ridge 14 is formed on the surface of the nitride semiconductor. Cavity planes are formed at the end faces in a direction substantially perpendicular to the direction in which this ridge 14 extends.

A first protective film 15 is formed on both sides of the ridge 14, and from the base portion of the ridge 14 on the top face of the p-side semiconductor layer 13 (a nitride semiconductor layer). The "ridge base portion" here refers to the outer peripheral portion of the ridge on the nitride semiconductor top face, not including the side faces of the ridge 14. That is, the first protective film 15 is disposed so as to be in contact with the nitride semiconductor layer from the ridge base portion to the ridge side faces. The first protective film 15 is in contact with the nitride semiconductor layer on at least part, and preferably all, of the ridge side faces and the ridge base portion from the nitride semiconductor layer top face.

An electrode 7 is formed from the top face of the ridge 14, to both side faces, to the base portion of the ridge 14, and on the top face of the p-side semiconductor layer 13. This electrode 7 is in contact with the nitride semiconductor layer on the top face of the ridge 14, and is disposed via the first protective film 15 on the ridge side faces, the base portion, and the p-side semiconductor layer 13 top face. However, voids 16 defined by the first protective film 15 and the electrode 7 are provided at least at the ridge base portion. Thus, at the ridge base portion, the electrode 7 is disposed on the nitride semiconductor via the first protective film 15 and the void 16. A p-side pad electrode 20 is usually formed on this electrode 7.

A second protective film 19 is formed on the exposed surfaces of the n-side semiconductor layer 11 and the side faces of the nitride semiconductor layer.

Furthermore, an n-side electrode 21 is formed on a different side from the first face side of the substrate 10 on which the electrode 7 is disposed.

Figure 9:
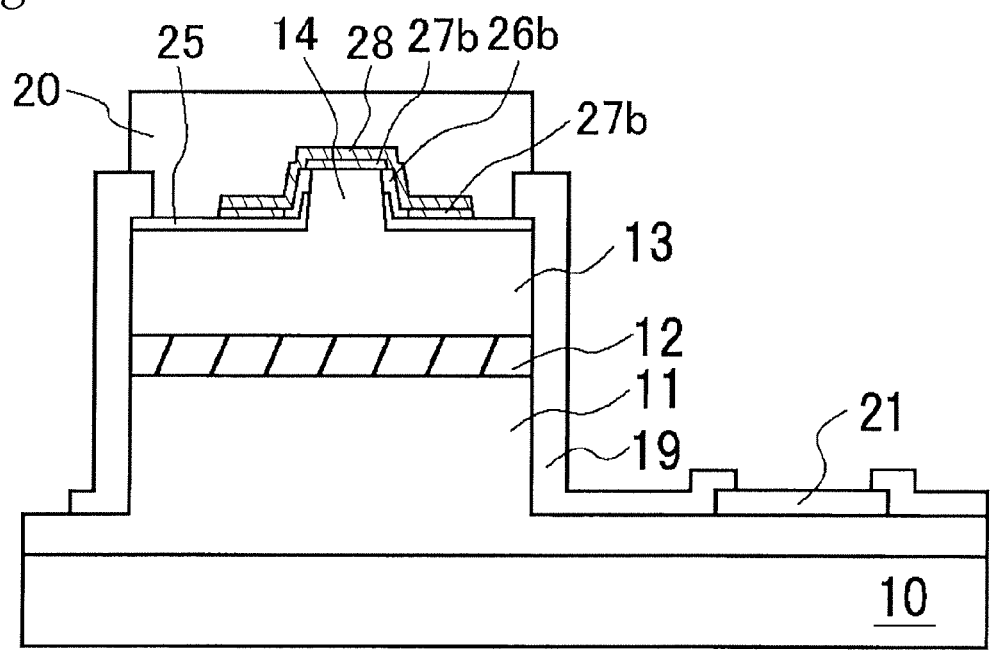
FIG. 9 is a schematic cross-sectional view describing a structure of another nitride semiconductor laser element manufactured by the present invention.

As shown in FIG. 9, the n-side electrode 21 may be formed on the exposed surfaces of the n-side semiconductor layer 11.

Voids 16, Etc.

Figure 2A:
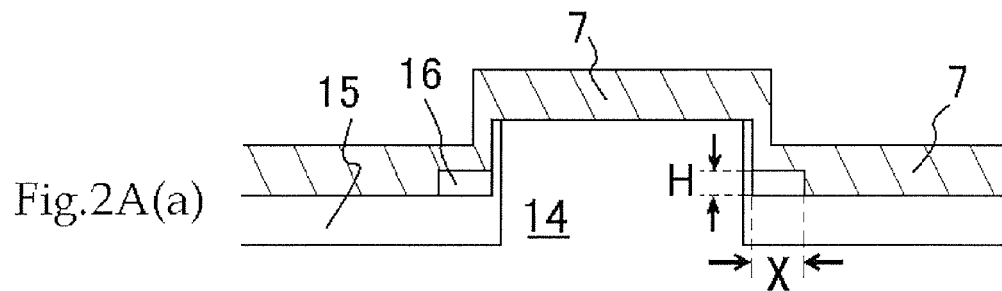
FIG. 2A is a schematic partial enlarged cross-sectional view describing other structures of a void (a) to (e) of a nitride semiconductor laser element manufactured by the present invention.
Figure 2A:
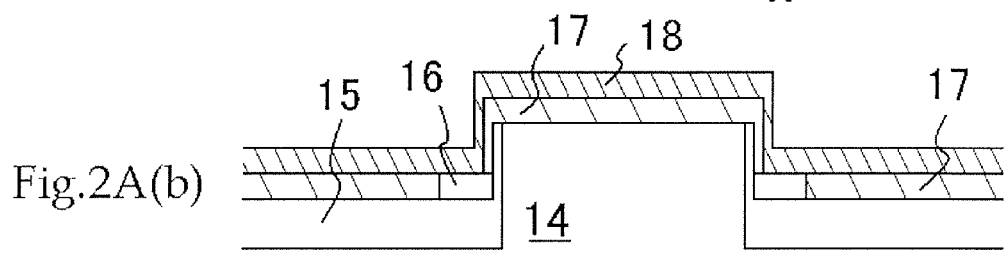
Figure 2A:
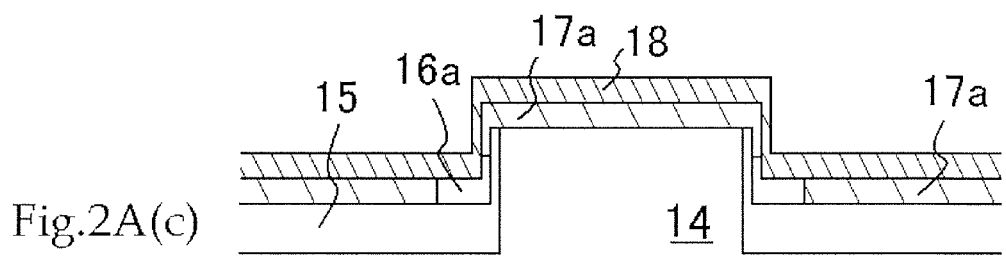
Figure 2A:
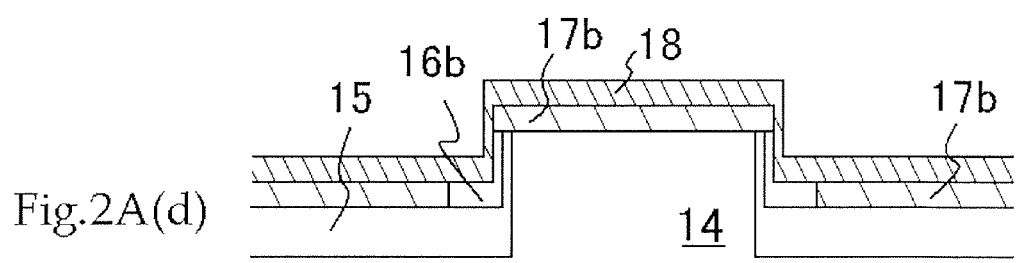
Figure 2A:
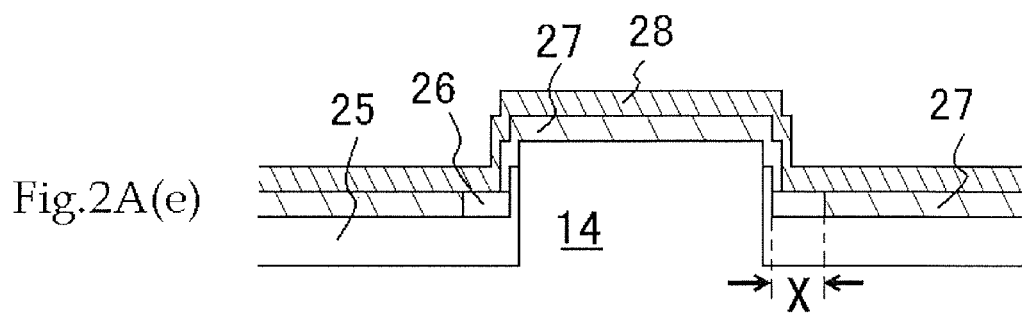

The voids (i.e., hollow or gap) may have a cross sectional shape as shown in FIGS. 2A (a), (b), and (e), on the ridge 14 base portion on the first protective film 15 or 25. Therefore, the voids 16 or 26 are defined by the first protective film 15 or 25 and the electrodes (7, or 17 and 18, or 27 and 28) at least at the ridge 14 base portion. In other words, at the ridge base portion, essentially a nitride semiconductor layer, a first protective film, a void, and an electrode are formed in that order starting from the bottom. As will be discussed below, there may be a partial region in which a nitride semiconductor layer, a first protective film, an electrode, a void, and an electrode are formed in that order starting from the bottom.

By thus disposing voids via at least the first protective film 15 or 25 at the base portion of the ridge 14, the absorption of laser light by the electrode disposed thereon can be reduced. In particular, the absorption of laser light by the electrode can be further reduced by substantially removing the electrode of poor film quality formed on the ridge side faces. Furthermore, light can be favorably confined by the disposition of the first protective film and the voids.

There are no particular restrictions on the size or shape of the voids 16 and 26, but they can be suitably adjusted so as to dispose at least the ridge 14 base portion. Consequently, it is possible to lessen the stress exerted at boundaries, such as between the first protective film and the electrode, or the first protective film and the ridge. As a result, this stress can be effectively suppressed, and this further extends the service life.

However, as long as the voids are disposed on the first protective film at least at the ridge base portion, they may be disposed on the electrode. That is, as discussed above, with a nitride semiconductor laser element comprising a nitride semiconductor layer, a first protective film, and an electrode, the first protective film may be disposed partially or entirely in contact with the nitride semiconductor layer, from the top face of the nitride semiconductor layer all the way to the ridge base portion and both sides of the ridge, and there may be voids defined by the electrode at least at the ridge base portion.

For example, when the electrode has a laminated structure as discussed below, depending on how the voids are formed and other such factors, a state may result in which the electrode is formed as an extremely thin film on the first protective film at the ridge base portion, such as when, out of the electrode material formed on the first protective film at the ridge base portion, the electrode material on the side closer to the first protective film remains behind while the electrode material on the side farther away from the first protective film is removed. With an electrode in such an extremely thin film state, even if it remains entirely or partially on the first protective film and is disposed under the voids, it will not absorb the laser light emitted from the light emitting layer, no stress caused by the electrode will be imparted to the nitride semiconductor layer, and there will be no effect on optical confinement. Thus, disposing the voids in this manner is permitted in the present invention. Also, even if a thin-film electrode is not disposed such that it is visible under an electron microscope or the like, there may be cases in which electrode material is measured by STEM or other such element analysis or the like, and the disposition of voids in such a state is similarly permitted.

For instance, there are no particular restrictions on the size of the voids at the ridge 14 base portion on the first protective film 15, but in a specific example, the width of the void (X in FIG. 2A (a)) is about 150 to about 3000 nm, with about 150 to about 1500 nm being preferable, and about 300 nm to about 500 nm being even better. There are no particular restrictions on the thickness of the voids 16 (H in FIG. 2A (a)), and it can be suitably adjusted according to the thickness of the electrode 7, the method for forming the voids 16, and so on.

Also, as shown in FIGS. 2A (c) and 2B (f), voids 16a or 26a may be disposed on part of the side faces of the ridge 14 from the base portion of the ridge 14. In this case, the voids may be disposed via the first protective film 15 on the ridge side faces. Also, as shown in FIGS. 2A (d) and 2B (g), voids 16b or 26b may be disposed over the entire surface of the ridge 14 side faces from the ridge 14 base portion. In this case, the voids may be disposed via the first protective film 15 on the ridge side faces, or they may be disposed without the first protective film 15, in direct contact with ridge side upper faces. There are no particular restrictions on the height of the voids on the side faces of the ridge 14, as long as it is no more than the remainder of subtracting the thickness of the first protective film from the ridge height. Also, these voids are preferably linked from the base portion of the ridge 14 to the side faces.

Figure 2B:
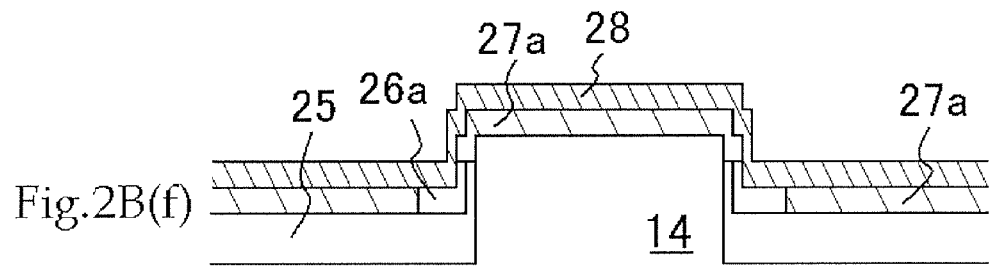
FIG. 2B is a schematic partial enlarged cross-sectional view describing other structures of a void (f) to (i) of a nitride semiconductor laser element manufactured by the present invention.
Figure 2B:
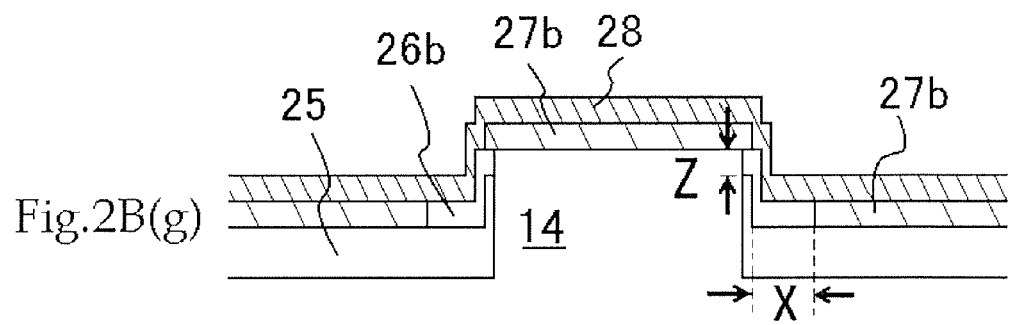
Figure 2B:
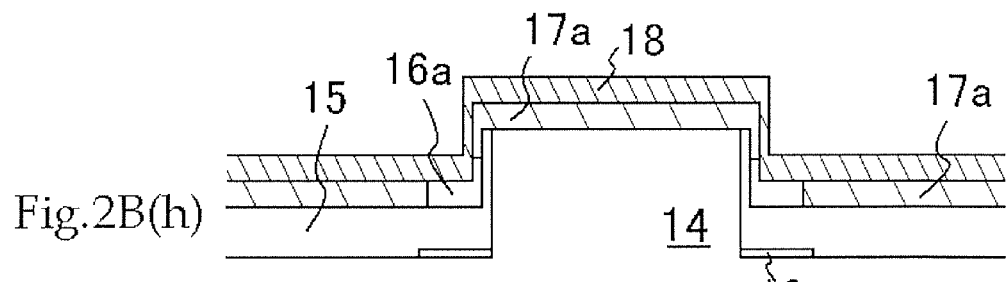
Figure 2B:
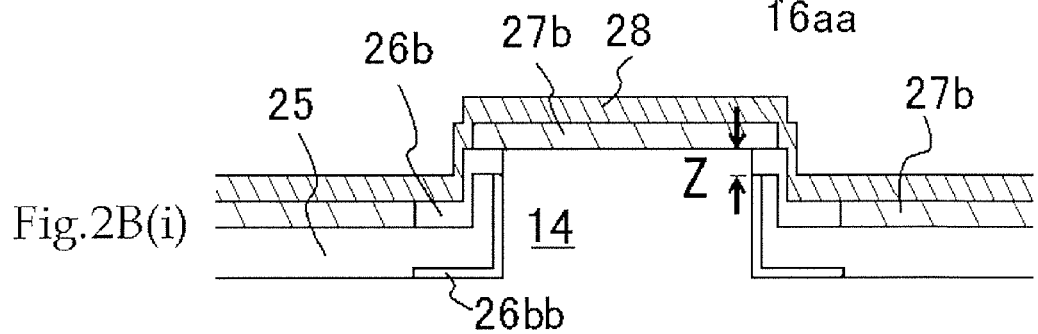
Figure 3A:
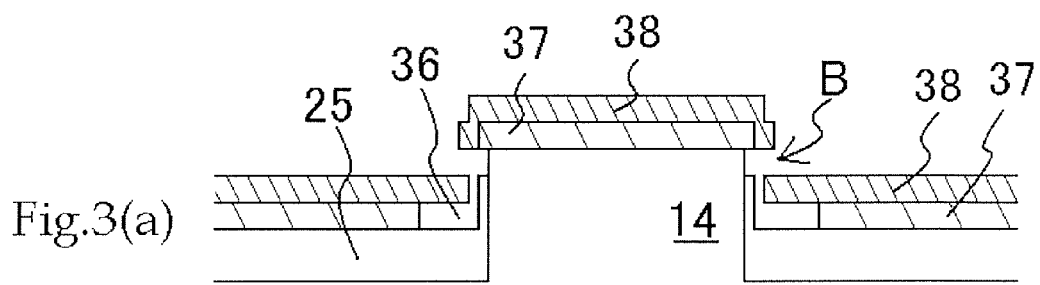
FIG. 3 is a schematic partial enlarged cross-sectional view describing other structures of a void (a) to (e) of a nitride semiconductor laser element manufactured by the present invention.
Figure 3B:
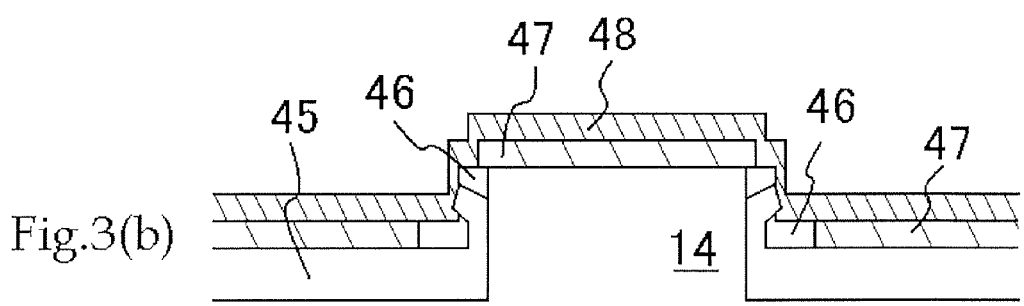
Figure 3C:
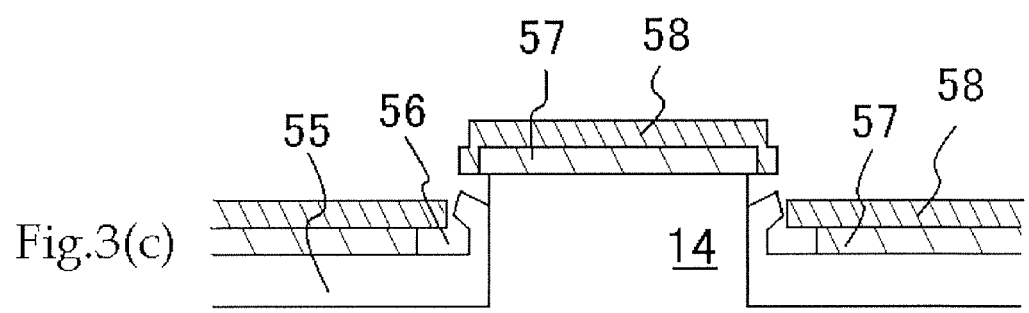
Figure 3D:
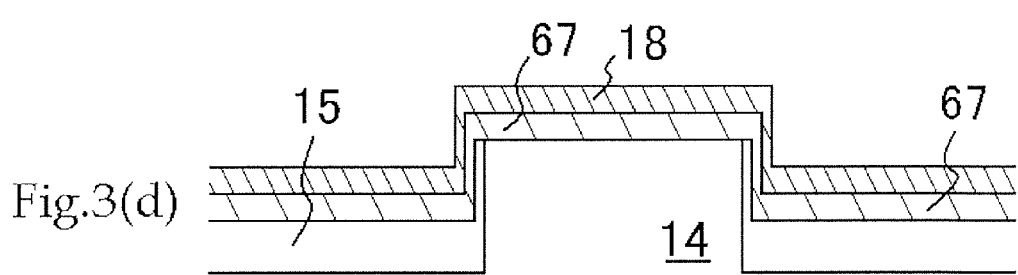
Figure 3E:
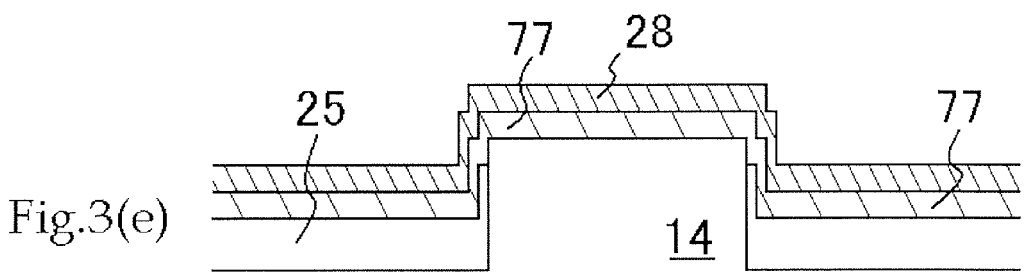

As discussed below, when the first protective film is formed so as to expose a part of the side faces of the ridge (such as the upper side faces), as shown in FIG. 2B (g), the voids 26b may be in contact with the nitride semiconductor layer at the upper side faces of the ridge 14 and from the ridge 14 base portion to the ridge 14 side faces. That is, they may be disposed adjacent to the upper side faces of the ridge 14.

The voids 26b (or 16b) may extend to the upper face of the ridge 14, but when adhesion, reducing the contact surface area between the ridge 14 and the electrode 27, and so forth are taken into account, it is preferable for the voids not to reach the ridge upper face.

Here, an example of the contact height (Z in FIG. 2B (g)) of the voids 26b with the ridge 14 side faces is about 10 to about 70% of the ridge 14 height, with about 20 to about 40% being preferable. More specifically, if the ridge height is about 500 nm, the contact height of the voids is about 50 to about 350 nm, for example, with about 100 to about 200 nm being preferable. Thus setting the height makes it easier to control the size of the voids, and affords effective control of optical confinement.

Furthermore, as shown in FIG. 3 (a), part of the electrodes (37 and 38; discussed below) may have a gap B near the side faces of the ridge 14 (such as near the upper side faces). In this case, voids 36 extend all the way to the gap B. In FIG. 3 (a), the first protective film 25 exposes the side faces of the ridge 14, but the entire side faces of the ridge 14 may also be exposed.

Also, as shown in FIG. 3 (b), the shape of the first protective film 45 may be deformed so that part of it does not touch the upper end of the ridge 14 side faces, the result being that part of the upper end of the first protective film 45 at the ridge 14 side faces is in contact with the electrodes (47 and 48), so that the voids 46 are split by the electrode 48 from the side faces of the ridge 14 to the nitride semiconductor layer.

As shown in FIG. 3 (c), the shape of a first protective film 55 at the ridge 14 side faces is deformed the same as above, and part of the electrodes (57 and 58) has a gap near the side faces of the ridge 14, so part of the voids 56 is narrower in width, and this part may spread out to extend to the gap.

Although not shown in the drawings, these voids preferably have a shape that extends substantially parallel to the cavity direction. For example, each may be a single contiguous void in the cavity direction, or they may be divided up into a plurality of voids. This disposition of the voids, as discussed above, makes it possible to reduce laser light absorption caused by the electrodes disposed above, in the direction in which the ridge extends. However, they need not be disposed over the entire length in the cavity direction, as long as they are disposed along part thereof, and there may be a portion where there are no voids in the direction in which the ridge extends. That is, as shown in FIG. 3 (d), either the first protective film 15 covers substantially the entire surface of the side faces of the ridge 14, the electrodes (67 and 18) are continuously affixed thereon, and no voids are formed, or as shown in FIG. 3 (e), the first protective film 25 does not cover the side faces of the ridge 14, but the electrodes (77 and 28) disposed thereon are affixed on the first protective film 25 and the exposed surface of the ridge 14, and a portion where no voids are formed is present along part of the length in the direction in which the ridge extends.

The voids may also be a combination of the forms in the above-mentioned FIGS. 2A (a) to 2B (i) and FIGS. 3 (a) to 3 (c), present along the direction in which the ridge extends. In this case, it is good for about 50% or more of these voids to be disposed in the direction in which the ridge 14 extends, with about 80% or more being preferable, and it is even better if they are disposed over substantially the entire length in the cavity direction.

The ends of the voids on the cavity plane side are blocked off by a protective film, etc., or may be embedded, or may be left open. Therefore, the voids do not necessarily have to have the above-mentioned width and height over their entire region. Also, the voids need not be complete voids between the electrode and the ridge, or between the first protective film and the electrode, and as long as there is no adverse effect on the above-mentioned stress moderation, optical confinement, and the like, there may be some film residue or the like of the material used for a mask, the first protective film, the nitride semiconductor layer, etc.

Disposing the voids like this reduces optical absorption of laser light by the electrodes, etc., that would otherwise be at these locations. Also, the differential in refractive index between the voids and the ridge (the nitride semiconductor) also effectively works to confine light efficiently within the ridge. For example, if the voids are an air gap, since air has the lowest refractive index (1.0), the refractive index differential inside and outside the ridge will be greater than when there are no voids on the side faces of the ridge (light is confined by the refractive index differential between the ridge and the protective film), and optical confinement into the ridge can be increased. Furthermore, because there are voids, even if a material whose refractive index tends to fluctuate with respect to the heat is used for the first protective film, for example, the changes in the refractive index will tend not to have an effect, so light can be stably confined in the lateral direction. Consequently, the threshold can be lowered, less power will be used, and the service life can be extended.

Also, since stress caused by adhesion between the ridge side faces and the electrode can be reduced with respect to the ridge or the nitride semiconductor layer, it is possible to reduce current deterioration during continuous drive in particular.

Further, since the electrode is disposed not only on the ridge upper face, but all the way onto the first protective film, good adhesion to the ridge can be ensured at the sites in contact with the first protective film, and in particular the deterioration in voltage during continuous drive can be reduced.

Also, because a first protective film made of a stable material is disposed on the ridge side faces, there is little risk of oxidation or other such modification of the nitride semiconductor layer on the ridge side faces, so the characteristics during operation will be more stable.

Furthermore, there is a risk that heat will be trapped in the voids due to the effect of heat from the light emitting component, but since the voids are distant from the light emitting component, the heat is unlikely to affect the voids. Also, since the voids are touching the electrode, heat produced near the ridge can be efficiently dissipated through the electrode.

Nitride Semiconductor Layers 11, 12, and 13

The nitride semiconductor layer may include a semiconductor layer having a general formula of $In_xAl_yGa_{1-x-y}N$ ($0 \leq x \leq 1$, $0 \leq y \leq 1$, $0 \leq x+y \leq 1$). In addition to this, it may be used the semiconductor layer which is partly substituted with B as a group III element, or is substituted a part of N as a group V element with P or As. An n-side semiconductor layer may be doped with at least one n-type impurity of IV or VI group elements, such as Si, Ge, Sn, S, O, Ti, Zr, Cd, etc. A p-side semiconductor layer may be doped with at least one p-type impurity, such as Mg, Zn, Be, Mn, Ca, Sr, etc. The doped concentration is, for example, about $5 \times 10^{16}/cm^3$ to about $1 \times 10^{21}/cm^3$.

The nitride semiconductor layers preferably have an SCH (separate confinement heterostructure) structure, which is a separate optical confinement type of structure in which the n-side semiconductor layer and the p-side semiconductor layer have an optical guide layer constituting an optical waveguide, with an active layer sandwiched in between. The present invention is not limited to these structures, however.

The active layer may be either a multiple quantum well structure or a single quantum well structure. The active layer preferably has a lower bandgap energy than the first protective film (discussed below). The COD lever can be further enhanced by widening the bandgap energy of the end face, or in other words, by widening the impurity level near the cavity plane, and forming a window structure.

The ridge formed on the surface of a nitride semiconductor layer, such as the p-side semiconductor layer, functions as a waveguide region. The width of the ridge is about 1.0 to about 50.0 μm. When the beam shape is single mode, the width of the ridge is preferably about 1.0 to about 3.0 μm. The ridge height can be suitably adjusted according to the thickness, material, etc., of the layer constituting the p-side semiconductor layer, but an example is about 0.1 to about 2 μm. The ridge is preferably set to a length of about 100 to about 2000 μm in the cavity direction. The ridge need not have the same width over the entire length in the cavity direction, and its side faces may be vertical or tapered. The taper angle if tapered should be about 60 to about 90°.

A cavity (i.e., resonator) is formed in the nitride semiconductor layer, such as in the direction in which the ridge extends, with a pair of cavity planes formed perpendicular in this direction. The cavity planes may be oriented in the M axis, A axis, C axis, or R axis, for example, that is, may be a plane selected from the group consisting of the M plane (1-100), the A plane (11-20), the C plane (0001), or the R plane (1-102). The term cavity plane here refers to a region including the region corresponding to the NFP or the optical waveguide region, but may include a region other than one corresponding to the NFP or the optical waveguide region.

Substrate 10

The substrate in the nitride semiconductor laser element of the present invention may be an insulated substrate or a conductive substrate. With an insulated substrate, part of the nitride semiconductor layer is removed in the thickness direction to expose the n-side semiconductor layer, and an n-electrode (discussed below) can be disposed so as to be in contact with this exposed face (see FIG. 9). With a conductive substrate, an n-electrode can be disposed so as to be in contact with the face on the opposite side from the face where the nitride semiconductor layer is formed (see FIGS. 1A, 1B, and 8).

It is particularly favorable for the substrate to be a nitride semiconductor substrate, and preferably a nitride semiconductor substrate having an off angle off about 0 to 10° on the first main face and/or the second main face. The thickness of the substrate is about 50 μm to about 1 mm, for example.

First Protective Film 15, Etc.

With the nitride semiconductor laser element of the present invention, as discussed above, the first protective film 15 is formed over the surface of the nitride semiconductor layer and the side faces of the ridge. That is, the first protective film 15 is formed on the surface of the nitride semiconductor layer by exposing the nitride semiconductor layer top face in at least the region where the electrode is in direct contact with the ridge and an electrical connection is made (see FIGS. 1A, 1B, and 2A (a) to (d)). Also, the first protective film 15 may be formed so as to expose part of the side faces (such as the upper side faces) in addition to the top face of the ridge 14 (see FIGS. 2A (e), 2B (g), and 3 (a) to (c)). Further, the first protective film 15 need not be in contact with the entire ridge side faces and ridge base portion (this portion of non-contact is sometimes called a second void; see 16aa in FIG. 2B (h) and 26bb in FIG. 2B (i)). At the portion where the first protective film is in contact with the nitride semiconductor layer, the two are bonded well. Also, the first protective film 15 disposed on the side faces of the ridge 14 is preferably formed thinner than the first protective film disposed on the nitride semiconductor layer surface on both sides of the ridge 14.

The second voids can be formed by known dry or wet etching. Forming these second voids effectively suppresses stress at the boundary between the first protective film and the ridge, and further lengthens the service life. In addition, these second voids can stabilize optical confinement.

There are no particular restrictions on the size of these second voids, as long as they are large enough to effectively act on optical confinement and relieve stress as mentioned above. They may be the same size as the above-mentioned voids, or they may be smaller in width and/or height and/or volume.

The first protective film is usually formed from an insulating material with a lower refractive index than that of the nitride semiconductor layer. The refractive index can be measured with a spectroscopic ellipsometer that makes use of ellipsometry, and more specifically, it can be measured with an HS-190 made by J. A. Woollam or the like. For example, the first protective film may be a laminated structure or a single layer of a dielectric film or an insulating film of an oxide, nitride, oxynitride, or the like of Zr, Si, V, Nb, Hf, Ta, Al, Ce, In, Sb, Zn or the like. The first protective film can be easily formed or machined at the above-mentioned site by controlling its film quality. Thus, the first protective film is preferably a film that is monocrystalline, polycrystalline, amorphous, or partially these crystal states.

Thus forming the first protective film from the lower side faces of the ridge to the nitride semiconductor surface on both sides of the ridge ensures a refractive index differential with respect to the nitride semiconductor layer, and particularly the n-side semiconductor layer, allowing leakage of light from the active layer to be controlled, allowing light to be efficiently combined in the ridge, better ensuring insulation on both sides of the ridge, and avoiding the occurrence of leak current.

There are no particular restrictions on the thickness of the first protective film, but a range of about 100 to about 2000 nm, and especially a range of about 10 to about 500 nm, is favorable, for example, depending on the location thereof. Capacity can be further reduced by making the first protective film thicker. It is also preferable for the first protective film to have a uniform film thickness in the region other than at the ridge side faces. This makes it easier to control capacity.

Electrodes 7, 17 and 18, Etc.

The electrode 7, 17 and 18, etc., is or are formed on the top face of the ridge. This electrode is electrically connected through contact with the top face of the ridge 14, and covers the surface of the semiconductor layer 13 and the side faces of the ridge 14, via (or partially via) the first protective film 15 on the side faces of the 14 and partially via the voids 16, etc. However, this electrode need not have this structure over the entire length in the direction in which the ridge extends. That is, it may not cover (may be cut out at) the ridge side faces in part of the direction in which the ridge extends, may be disposed via the first protective film over the entire surface of the ridge side faces, may be disposed in direct contact with the ridge side faces, or may not have voids between itself and the first protective film. Thus, when the electrode is disposed all the way to the ridge side faces, or to the nitride semiconductor layer on both sides of the ridge, this effectively prevents the first protective film formed on the ridge side faces from peeling off.

Figure 4A:
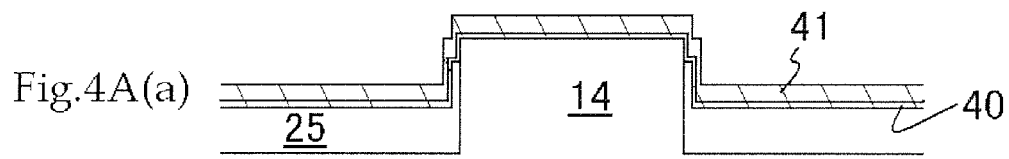
FIG. 4A is a schematic cross-sectional view describing a manufacturing method of a nitride semiconductor laser element manufactured by the present invention.
Figure 4A:
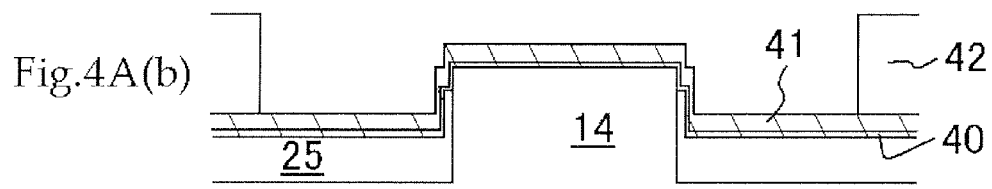
Figure 4A:
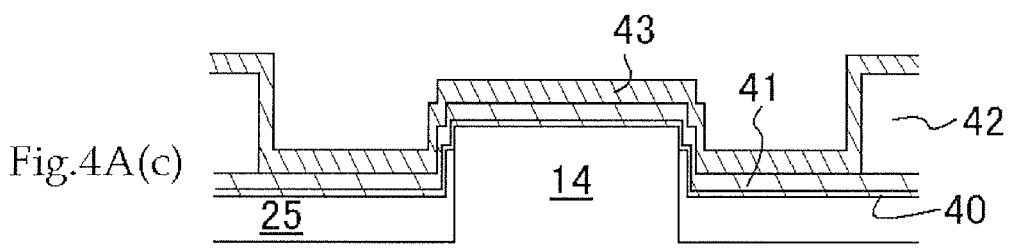
Figure 4A:
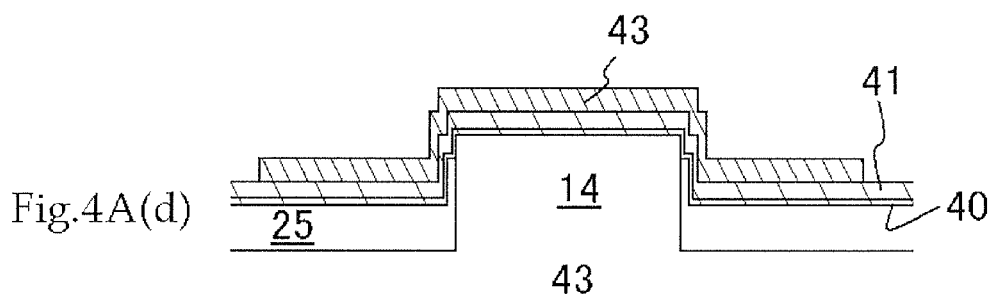
Figure 4A:
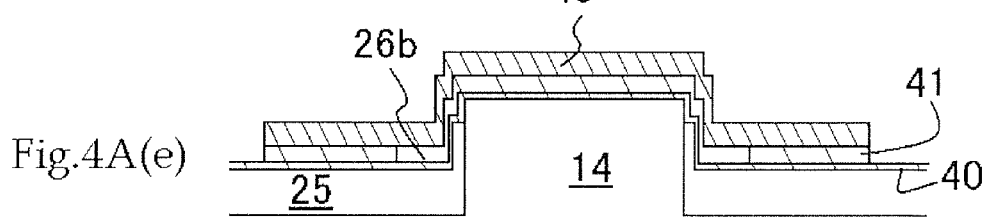
Figure 4A:
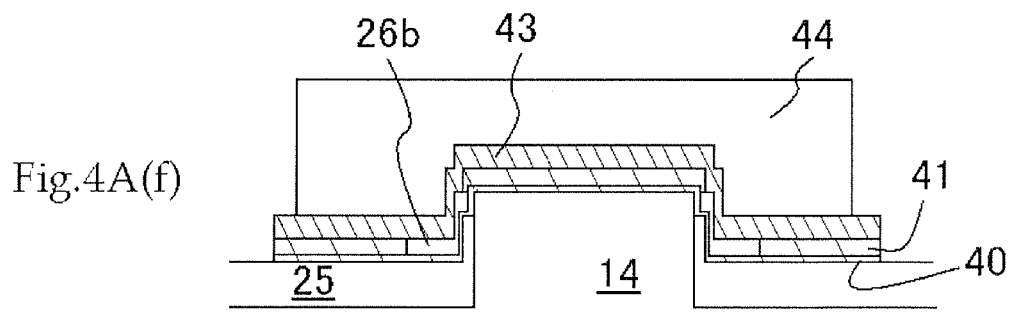

The term electrode here refers to an electrode formed for the purpose of making what is known as ohmic contact with the nitride semiconductor layer, and this electrode may be a single layer (7 in FIG. 1A, for example), but is preferably a laminated structure of two or more layers (17 and 18 in FIG. 1B, for example), and even more preferably a laminated structure of three or more layers (40, 41, and 43 in FIG. 4A (f), for example). The electrode with a laminated structure in this case need not have the same planar shape in all of its layers, and one or more of the layers in the laminated structure may have a different planar shape from that of the other layers.

The electrode may be a single layer or have a laminated structure of two or more layers as mentioned above, but some of those layers may not have a distinct layer structure. For instance, an electrode was formed by forming a two-layer conductive layer, but this may be changed into a thin film shape, an island shape, or the like by subsequent heat treatment or the like that alloys the conductive layer, creates a bias in distribution, deforms the layer, etc.

Therefore, if the electrode and the first protective film define the voids at the ridge 14 base portion, then the voids are defined by the first protective film, by the electrode disposed in island form on the first protective film, by the electrode present via the voids on the first protective film, etc. In other words, at the ridge base portion, there may be locations partially disposed in the order of the nitride semiconductor layer, the first protective film, the electrode, the voids, and the electrode.

As discussed above, when the voids are defined by the electrode at least at the ridge base portion, the "extremely thin film" when the electrode is disposed in the form of an extremely thin film on the first protective film at the ridge base portion refers to a thickness that will not affect optical confinement, light absorption, the imparting of stress to the nitride semiconductor layer, etc. More specifically, it is good for the thickness to be about 50 nm or less with the electrode material discussed below.

A pad electrode or the like may also be formed over this electrode.

The p- and n-electrodes can be formed with a single layer or laminated layer of a metal or metal alloy of palladium, platinum, nickel, gold, titanium, tungsten, cupper, silver, zinc, tin, indium, aluminum, iridium, rhodium, vanadium, ITO or the like. Examples of the material thereof includes, in particular as p-electrode, Ni—Au (for example, about 10-about 200 nm-thick), Ni—Au—Pt (for example, about 10-about 100 nm-about 100 nm-thick), Pd-pt, Ni—Pt. The p- and n-electrodes are suitable formed in a thickness, according to the material used, of about 50 to about 500 nm, for example.

Other Configuration

A second protective film 19 is preferably formed in part of the region on the first protective film 15. The second protective film 19 preferably further covers the side faces of the nitride semiconductor layers 11, 12, and 13 and/or the surface or side faces of the substrate 10, etc. The second protective film 19 may be formed of oxides such as Si, Mg, Al, Hf, Nb, Zr, Sc, Ta, Ga, Zn, Y, B, Ti, etc., and preferably formed of $Al_2O3$, $SiO_2$. The second protective film 19 may be made of the same material as the first protective film 15, or made of a different material. This not only provides insulation, but also reliably protects the exposed side faces, surface, etc., of the nitride semiconductor layers. The second protective film 19 may have a single-layer structure or a laminated structure. More specifically, examples include a single layer of an oxide of silicon, a single layer of an oxide of aluminum, and a laminated structure of an oxide of silicon and an oxide of aluminum. Forming this film allows the first protective film to be affixed more securely to the cavity plane. As a result, stable operation can be ensured and the COD level can be raised.

There are no particular restrictions on the thickness of the second protective film 19, but about 100 to about 1000 nm is favorable, for example. It is even better if the material is the same as that of the first protective film. This will suppress cracking in the first and second protective films because the two films will have the same coefficient of thermal expansion.

Method for Manufacturing Nitride Semiconductor Laser Element

The following are examples of the method for manufacturing the nitride semiconductor laser element of the present invention.

(a) Forming the Nitride Semiconductor Layers

First, a nitride semiconductor substrate having an off angle of about 0 to 10° on the first main face and second main face, for example, is prepared as a substrate.

The nitride semiconductor substrate can be formed by a vapor phase growth method such as MOCVD (Metal Organic Chemical Vapor Deposition), MOVPE (Metal Organic Vapor Phase Deposition), HVPE (Hydride Vapor Phase Epitaxy), MBE (Molecular Beam Epitaxy) or the like, a hydrothermal synthesis method in which crystals are grown in a supercritical fluid, a high pressure method, a flux method, a melt method, or the like. Also, a various known substrate described in JP-2006-24703-A and a commercially available substrate can be used, for example.

Nitride semiconductor layers are grown on the first main face of this nitride semiconductor substrate.

The nitride semiconductor layers are preferably grown in the order of the n-side semiconductor layer, the active layer, and the p-side semiconductor layer, or in the reverse order.

There is no particular restriction on a growth method of the nitride semiconductor layer, it can be formed by means of any known method which can grow these nitride semiconductor layers, such as MOCVD, MOVPE, HVPE, MBE or the like. In particular, MOCVD is preferable because it allows the nitride semiconductor to be growth with good crystallinity. Specific examples thereof include a method in which the nitride semiconductor layer may be formed by MOCVD or the like under the condition of reduced pressure to atmospheric pressure.

The n-side semiconductor layer is preferably formed as a multilayer film. For example, a first n-side semiconductor layer is $Al_xGa_{1-x}N$ ($0 \leq x \leq 0.5$), and preferably $Al_xGa_{1-x}N$ ($0 \leq x \leq 0.3$). An example of more specific growth conditions is to use a growth temperature inside the reaction furnace of at least about 1000° C., and a pressure of about 600 Torr or less.

The first n-side semiconductor layer can also function as a clad layer. The film thickness is favorably about 0.5 to about 5 μm.

The second n-side semiconductor layer can function as a light guide layer, and can be formed of $Al_xGa_{1-x}N$ ($0 \leq x \leq 0.3$). The film thickness is favorably about 0.5 to about 5 μm.

The active layer is preferably includes at least indium, and is preferable $In_xAl_yGa_{1-x-y}N$ ($0<x \leq 1$, $0 \leq y \leq 1$, and $0 \leq x+y \leq 1$). It is possible to emit a light of ultraviolet band by increase in Al content, and long wavelength of about 360 to 580 nm. The active layer may be a multiple quantum well or single quantum well structure, this allows to improve an emission efficiency.

A p-side semiconductor layer is laminated on the active layer. An example of a first p-side semiconductor layer is $Al_xGa_{1-x}N$ ($0 \leq x \leq 0.5$) containing a p-type impurity.

The first p-side semiconductor layer functions as a p-side electron confinement layer.

A second p-side semiconductor layer can be formed from $Al_xGa_{1-x}N$ ($0 \leq x \leq 0.3$), and a third p-side semiconductor layer from $Al_xGa_{1-x}N$ ($0 \leq x \leq 0.5$) containing a p-type impurity. The third p-side semiconductor layer preferably has a superlattice structure composed of GaN and AlGaN, and functions as a clad layer.

A fourth p-side semiconductor layer can be formed from $Al_xGa_{1-x}N$ ($0 \leq x \leq 1$) containing a p-type impurity. Indium may be formed as a mixed crystal in these semiconductor layers. The first p-side semiconductor layer and the second p-side semiconductor layer can also be omitted. The film thickness of each layer is favorably about 3 nm to about 5 μm.

The n-side semiconductor layer and p-side semiconductor layer may have a single-film structure, a multilayer film structure, or a superlattice structure composed of two layers having different compositional ratios. With a multilayer film structure or a superlattice structure, all of the layers of the n-side semiconductor layer and the p-side semiconductor layer do not necessarily have to contain an n-type impurity and p-type impurity.

If desired, the nitride semiconductor layers may be etched to expose an n-side semiconductor layer (such as the first n-side semiconductor layer). This exposure can be accomplished, for example, by RIE (reactive ion etching), using $Cl_2$, $CCl_4$, $BCl_3$, $SiCO_4$ gas, or another such chlorine-based gas. This moderates the stress. In the above-mentioned exposure of the n-side semiconductor layer, a cavity plane may be formed simultaneously by etching. However, the cavity plane may instead be formed by cleavage in a separate step.

At any subsequent stage, the substrate thus obtained is preferably annealed in the reaction vessel at a temperature of about 700° C. or higher to lower the resistance of the p-side semiconductor layer.

(b) Formation of Ridge

A ridge is formed on the nitride semiconductor layers. For example, a mask pattern corresponding to the ridge shape is formed on the nitride semiconductor layers, and this mask pattern is used to form a ridge.

The mask pattern can be formed in any shape, using a known method such as photolithography or etching, and using $SiO_2$ or another such oxide film, or SiN or another such nitride. It is favorable for the thickness of the mask pattern to be such that the mask pattern remaining on the ridge after the formation of the ridge can be removed by lift-off in a subsequent step. An example is about 0.1 to about 5.0 μm. For instance, the mask pattern is preferably formed using a CVD apparatus or the like. It is also favorable for the mask pattern to be etched into the desired shape by RIE or another such method. It is good to use RTE and one of the above-mentioned chlorine-based gases in this etching.

After this, the ridge is formed by using the mask pattern to etch the nitride semiconductor layer surface. It is good to use RIE and one of the above-mentioned chlorine-based gases in this etching. There are no particular restrictions on the substrate temperature in this etching, but a low temperature is preferable (such as about 60 to about 200° C.).

(c) Formation of First Protective Film

A first protective film is formed on the nitride semiconductor layer including the ridge. In this case, the first protective film is preferably formed on the nitride semiconductor layer in a state in which the mask pattern used in the above-mentioned formation of the ridge is left in place.

The first protective film can be formed by any method that is known in this field. For example, vapor deposition, sputtering, reactive sputtering, ECR plasma sputtering, magnetron sputtering, ion beam assisted vapor deposition, ion plating, laser ablation, CVD, spraying, spin coating, dipping, a combination of two or more of these methods, or any of various other methods that combine these methods with heat treatment. In this case, a single layer or a laminated structure can be formed in the desired film thickness using the desired materials.

The first protective film here is preferably formed by controlling the film formation conditions, etc., and selecting appropriate materials, so that the film thickness at the ridge side faces will be less than the thickness of the film formed on the nitride semiconductor layer surface in the region other than the ridge side faces.

The first protective film is preferably disposed as a thin film that is easily lifted off, at locations corresponding to the shoulders of the ridge (near the ridge side faces, that is, locations extending from the side faces of the ridge to its top face). In this case, the ridge side faces can be easily exposed in a step that will be discussed below.

For example, a single-layer film in which the thickness varies with the film properties and location, but the composition is the same, may be formed one or more times by varying the manufacturing method or conditions. More specifically, with a first protective film formed by magnetron sputtering, the etching rate can be higher than with a first protective film formed by ECR sputtering, and in particular a film with a different thickness can be easily formed on the ridge side faces.

Also, a first protective film formed by ECR sputtering will have poor film properties at the protruding corners of the nitride semiconductor layer, and so can be easily lifted off from only these portions, so such a first protective film can be utilized.

The first protective film may be formed such that second voids end up being formed at a portion of the ridge side faces and the ridge base portion from the top face of the nitride semiconductor layer after the manufacture of the nitride semiconductor laser element. Examples of such a formation method include disposing film properties that allow easy lift-off at a portion of this film, partially subjecting the nitride semiconductor surface to treatment prior to the formation of the first protective film, partially treating the first protective film, and combining these methods.

(d) Removal of First Protective Film

The first protective film is removed from at least a top face of the ridge. In order to perform this, at least the mask pattern and the first protective film that is on the mask pattern are removed. For example, the mask pattern located above the ridge top face, and the first protective film on this mask pattern, can be removed by lifting off the mask pattern used in forming the ridge.

The mask pattern and the first protective film that is directly over it can be removed by selecting the etchant used for lift-off, or sequentially using different kinds of etchant, or adjusting the concentration of etchant, or adjusting the etching time, for example. Also, rather than removing just the first protective film directly over the mask pattern, the first protective film may be removed so as to expose the side faces of the ridge from the first protective film. Furthermore, as discussed above, the ridge side faces may be formed as a thin film and/or the film properties, etc., of the ridge shoulders may be varied, for example, to remove the mask pattern and the first protective film that is directly over it, or to remove not just the first protective film directly over the mask pattern, but also a part of the first protective film that is on the side faces or the shoulders of the ridge. Also, after lift-off has been performed, the first protective film may be removed from locations corresponding the ridge shoulders by a separate etching and using a mask pattern as desired.

The first protective film on at least the lower face of the ridge is preferably not removed, and covers and is affixed to part of the side faces of the ridge. This effectively prevents the first protective film from peeling off.

(e) Lamination of Conductive Layer

A conductive layer composed either of a single conductive layer or of a multilayer film (two or more layers) with different compositions is laminated on the first protective film and the nitride semiconductor layer obtained above. When a conductive layer composed of a multilayer film is laminated, it is preferable to select one in which the films have different etching rates, according to the specified etching method, conditions, etc., for example. Here, it is favorable for partial gaps to be introduced at locations corresponding to the shoulders from the base portion of the ridge in at least the uppermost conductive layer.

There are no particular restrictions on the method for forming the conductive layer, but with a single-layer structure composed of gold, for example, the gold is formed in a thickness of about 50 to about 300 nm. For instance, with a two-layer structure composed of nickel and gold, first a nickel layer is formed in a thickness of about 5 to about 20 nm over the nitride semiconductor layer, and then a gold layer is formed in a thickness of about 50 to about 300 nm. With a two-layer structure composed of gold and platinum, first a layer of gold is formed in a thickness of about 50 to about 200 nm on the nitride semiconductor layer, and then a layer of platinum is formed in a thickness of about 50 to about 200 nm. Also, when the p-electrode has a three-layer structure, the order of formation is preferably Ni—Au—Pt or Ni—Au—Pd. For example, an about 10 nm layer of nickel and an about 100 nm layer of gold are formed, and a layer of platinum, palladium, or the like that will serve as the uppermost layer is formed in a thickness of about 50 to 500 nm. Furthermore, rhodium, palladium, silver, platinum, gold, or the like may be formed in the desired thickness, combined as desired, at the desired location, and by the desired formation method. When the conductive layer is formed from three or more layers, however, they may all be formed at a different etching rate, but the etching rates do not necessarily all have to be different, and it is preferable if the compositions are different and/or the etching rates are different in at least two of the conductive layers.

The conductive layer can be formed, for example, by a method that is known in this field. For instance, this can be vapor deposition, sputtering, reactive sputtering, ECR plasma sputtering, magnetron sputtering, ion beam assist deposition, ion plating, laser ablation, CVD, a combination of these two or more methods. In the combination method, the conductive layer is preferably formed using the desired material, in the desired thickness and at the desired condition.

When partial gaps are introduced at locations of the uppermost conductive layer corresponding to the shoulders from the base portion of the ridge, either simultaneously or continuously with the lamination of the conductive layer, an example is a method in which (i) a conductive layer is laminated by the method discussed above, after which a mask pattern having openings at the portions corresponding to the gaps is formed, and this mask pattern is used for wet or dry etching. In another example, (ii) this mask pattern is used as desired, an angle is selected that will allow a partial thinning of the conductive layer, and the conductive layer is sputtered to introduce partial gaps.

Various other methods can also be used, such as:

(iii) in forming the above-mentioned conductive layers, the uppermost conductive layer is formed with inferior properties by varying the conditions, such as speeding up the film formation rate, (iv) gaps are introduced by forming the top conductive layer with inferior properties and partially etching the uppermost conductive layer, (v) in forming the uppermost conductive layer, the conditions, materials, etc., are selected so that the presence or absence of a first protective film (underneath) or another such factor is utilized to introduce gaps at locations of the uppermost conductive layer corresponding to the base portion from the ridge shoulders, (vi) in forming the ridge, the angle of inclination of the ridge side faces can be adjusted so that gaps can be introduced at locations of the uppermost conductive layer corresponding to the base portion from the ridge shoulders, by an ordinary method for forming a conductive layer.

With these methods, the apparatus, conditions, materials, and so forth that are used can be any that are known in this field. As a result, as shown in FIGS. 5 (a) and (b), for example, a plurality of gaps 22 or 23 can be introduced into the uppermost conductive layer 43.

In this case, as shown in FIG. 5 (b), for example, introducing the gaps 23 only near the base portion of the uppermost conductive layer 43 (or the top surface of the conductive layer) allows the voids to be formed in a subsequent step at the locations shown in FIGS. 2A (a), 2A (b), and 2A (e).

Also, as shown in FIG. 5 (a), introducing the gaps 22 near the shoulders of the uppermost conductive layer 43 allows the voids to be formed in a subsequent step at the locations shown in FIGS. 2A (c), 2A (d), 2B (f), and 2B (g).

There are no particular restrictions on the size or density of the gaps in this case, but they preferably have enough thickness and surface area to ultimately function as an electrode. This method for introducing gaps may be used to form a conductive layer not only at the uppermost layer, but also those disposed lower.

The electrode that is in contact with the ridge top face is formed by the lamination of the above-mentioned conductive layers. The method for forming the electrode in this case may be any known method. For example, of the conductive layers in the laminated structure, the conductive layers other than the uppermost are formed, after which a lift-off pattern having an opening only at the electrode formation portion is formed, the uppermost conductive layer is formed on this, and lift-off is then performed. Consequently, the uppermost layer is patterned into an electrode of the desired shape, and this patterned electrode is used as a mask to pattern the underlying conductive layers, thereby forming an electrode in the desired shape.

Also, a method may be used in which, prior to forming the conductive layers, a lift-off pattern having an opening only at the electrode formation portion is formed, the conductive layers of the laminated structure are formed on this, and then the conductive layers of the laminated structure are subjected to lift-off to form an electrode of the desired shape.

Therefore, a method in which the above-mentioned conductive layers of the laminated structure are formed, and gaps are formed in the uppermost layer thereof may be suitably combined with the above-mentioned electrode formation method, which is preferable in that the conductive layers of the laminated structure are patterned into the desired electrode.

(f) Formation of Voids

The gaps in the uppermost conductive layer (or the top surface) are used to remove part of the inside with a single conductive layer, or part of the underlying conductive layers with a conductive layer having a laminated structure. Consequently, voids defined by the first protective film and the conductive layer can be formed at least at the ridge base portion.

This removal of part of the conductive layer can be accomplished by a known dry or wet etching process. Favorable methods include wet etching in which one or more of a hydrofluoric acid (HF) solution, a buffered hydrofluoric acid (BHF) solution, a mixture of hydrochloric acid and acetic acid or the like, or another such chlorine-based solution, a nitric acid-based solution, a hot concentrated sulfuric acid-based solution, or another such acidifying solution, aqua regia, an iodine-potassium iodide solution, or the like are mixed, or two or more of these are used in succession; lift-off method; dry etching with a chlorine-based gas; and the like. Here, the etching is performed so as to form voids adjacent to part of the side faces of the ridge by utilizing the gaps in the uppermost conductive layer (or the top surface) as discussed above, and by suitably adjusting the various conditions, such as the material of the underlying conductive layers, the film thickness, the laminate structure, the film formation method, the etching method, the type of etchant, the concentration of etchant, the etching time, and so forth.

If the first protective film remains, without exposing the ridge side faces, the following steps may be carried out without any modification, but the first protective film may also be removed so as to expose part of the ridge side faces of the first protective film simultaneously with the removal of the conductive layer by suitably selecting the material of the first protective film, the film properties, the film thickness, the material of the underlying conductive layers, and so forth. At this stage, the shape and size of the voids can be adjusted by adjusting various parameters, such as the ridge inclination angle, the type of etchant, the concentration, the treatment (immersion) time, and so forth. More specifically, if the underlying layers contain nickel, the nickel can be etched away with a hydrochloric acid-based solution such as a mixture of hydrochloric acid and acetic acid or the like; rhodium, palladium, and silver can be etched away with a nitric acid-based or hot concentrated sulfuric acid-based solution, or the like; platinum can be etched away with aqua regia or the like; and gold can be etched away with an iodine-potassium iodide solution, aqua regia, or the like. Therefore, a method in which these materials are selected, and the lamination order and etchant are suitably selected is preferable.

When the conductive layer has a laminated structure of three or more layers, and when, for example, the lowermost conductive layer (that is, the third conductive layer) is formed from a material with a different etching rate from that of the overlying conductive layer and the uppermost conductive layer (that is, the second conductive layer), then after step (f), a mask pattern may be formed on part of the surface of the nitride semiconductor layer on the top face, the side faces, and both sides of the ridge, and this mask pattern used to remove part of the lowermost conductive layer.

Also, in step (f), the above-mentioned mask pattern may be used to remove all or part of the lowermost conductive layer (that is, the third conductive layer) along with the upper conductive layer (that is, the first conductive layer).

The voids can be more reliably formed, without subjecting the uppermost conductive layer to any etching damage, by separately forming a mask pattern and removing part of the conductive layer. That is, this helps extend the voids in the direction in which the ridge extends, and allows them to be reliably extended onto the nitride semiconductor layer on both sides of the ridge.

As to the removal of the conductive layer here, it may end up being completely removed at the locations where the voids are disposed, or it may be left in the form of a thin film, islands, or the like. The thickness of the conductive layer that remains should be small enough not to affect the confinement of light emitted from the active layer, and so forth. Also, the thickness may be such that optical confinement and so forth are not affected by alloying with annealing, etc., in a subsequent step. More specifically, an example is about 5 to about 20 nm, although it will depend on the material.

Ohmic annealing is preferably performed at some stage of the process, such as after the formation of a conductive layer with a multilayer structure, or after the patterning of the conductive layer (formation of the voids). For example, favorable annealing conditions would be about 300° C. or higher, and preferably about 500° C. or higher, under an atmosphere that contains nitrogen and/or oxygen.

In the step discussed above, even if the conductive layer is formed with a laminated structure, it may change into a single-layer structure, or one or more of the layers may become a thin film or be unevenly distributed, due to alloying of two or more of the layers in the annealing step, depending on the material.

A second protective film may be formed over the first protective film at some stage after step (f). The second protective film can be formed by any method that is known in this field.

Also, a pad electrode 20 may be formed over the electrode formed on the above-mentioned ridge, if desired. The pad electrode is preferably a laminate composed of nickel, titanium, gold, platinum, palladium, tungsten, or another such metal. More specifically, the pad electrode can be formed in the order of Ni—Ti—Au or W—Pd—Au, starting from the electrode side. There are no particular restrictions on the thickness of the pad electrode, but the thickness of the final layer of gold is preferably about 100 nm or more.

Furthermore, a separate electrode may be formed over any of the semiconductor layers on the first main face of the nitride semiconductor substrate (see 21 in FIG. 9), or a separate electrode may be formed on all or part of the second main face of the nitride semiconductor substrate (see 21 in FIGS.

1A, 1B, and 8). For instance, vanadium (about 10 nm thickness) platinum (about 200 nm thickness), and gold (about 300 nm thickness) can be formed, starting from the second main face of the substrate. This separate electrode can be formed, for example, by sputtering, CVD, vapor deposition, or the like, and is preferably a two- to four-layer structure composed of V/Pt/Au, Ti/Au/Pt/Au, Mo/Pt/Au, W/Pt/Au, Ti/Pd/Al, Ti/Al, Cr/Au, W/Al, Rh/Al, or Ti/Pt/Au. It is preferable to use lift-off to form the separate electrode, and it is preferable to perform annealing at about 500° C. or higher after the separate electrode has been formed, but the annealing can also be omitted. A metallized electrode may also be formed on this separate electrode. A metallized electrode may be, for example, Ti—Pt—Au—(Au/Sn), Ti—Pt—Au—(Au/Si), Ti—Pt—Au—(Au/Ge), Ti—Pt—Au—In, Au/Sn, In, Au/Si, Au/Ge and the like.

Formation of Chip

At some stage, preferably after the electrode has been formed, the substrate including the nitride semiconductor layer is usually split into bars to form the cavity plane of the nitride semiconductor layer in a direction substantially perpendicular to the direction in which this ridge extends. The cavity plane here is preferably the M plane (1-100) or the A plane (11-20). Methods for splitting the substrate including the nitride semiconductor layer into bars include blade breaking, roller breaking, and press breaking.

A reflective mirror may also be formed at the cavity plane. The reflective mirror is preferably a dielectric multilayer film composed of $SiO_2$, $ZrO_2$, $TiO_2$, $Al_2O_3$, $Nb_2O_5$, AlN, $Ta_2O_5$, or the like. The reflective mirror is preferably formed on the light reflecting face or the light emitting face of the cavity plane. If the cavity plane is formed by cleavage, then the reflective mirror can be formed with better reproducibility. The end faces of the voids may also be covered by a mirror. This prevents dust and the like from getting into the voids during a subsequent step or the drive of the laser, and prevents a decrease in the function of the voids.

The nitride semiconductor substrate bars are usually split parallel to the stripe direction of the electrode to make chips of the nitride semiconductor laser element.

Second voids can be formed during the formation of the first protective film, during the formation of the first voids discussed above, during the patterning or etching of the electrode, and so forth, simultaneously with the formation of these.

Examples of the nitride semiconductor laser element and manufacturing method thereof of the present invention will now be described in detail through reference to the drawings.

Example 1

Nitride Semiconductor Laser Element

Figure 8:
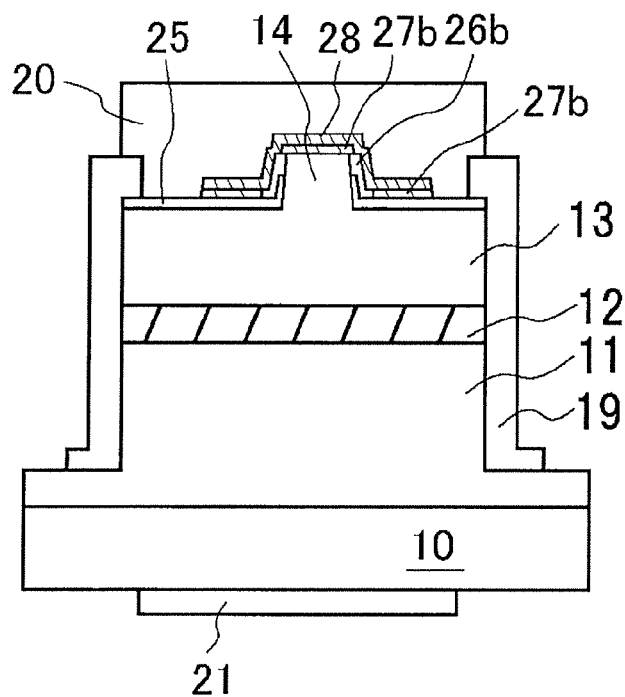
FIG. 8 is a schematic cross-sectional view describing a structure of another nitride semiconductor laser element manufactured by the present invention.

The laser element in this Example is an element that oscillates in the 500 nm band or lower, and as shown in FIG. 8, an n-side clad layer (2 μm) composed of silicon-doped $Al_{0.33}Ga_{0.67}N$ and an n-side light guide layer (0.15 μm) composed of undoped GaN were formed as the n-side semiconductor layer 11 on the substrate 10 composed of n-type GaN. As the active layer 12, a barrier layer (7 nm) composed of silicon-doped $In_{0.02}Ga_{0.98}N$ and a well layer (10 nm) composed of undoped $In_{0.06}Ga_{0.94}N$ were repeated twice, after which a barrier layer (5 nm) composed of silicon-doped $In_{0.02}Ga_{0.98}N$ was formed. Over this, a p-side cap layer (10 nm) composed of magnesium-doped p-side $Al_{0.30}Ga_{0.70}N$, a p-side light guide layer (0.15 μm) composed of undoped GaN, a p-side clad layer composed of a superlattice layer with a total thickness of 0.6 μm and consisting of a layer (2.5 nm) composed of undoped $Al_{0.05}Ga_{0.95}N$ and a layer (2.5 μm) composed of magnesium-doped GaN, and a p-side contact layer (15 nm) composed of magnesium-doped p-side GaN were formed as the p-side semiconductor layer 13.

A ridge 14 (inclination angle of 80°) in the form of a stripe that was about 0.7 μm high and about 2 μm wide was formed by etching on the surface of the p-side semiconductor layer.

A first protective film 25 composed of $ZrO_2$ was formed on the surface of the p-side semiconductor layer except for the top face and shoulders of the ridge 14.

Voids 26b were formed at positions adjacent to the side faces of the ridge 14. These voids 26b were disposed via the first protective film 25 over a portion of the nitride semiconductor layer on both sides of the ridge 14 and on the lower side faces of the ridge 14. The height Z voids 26b (see FIG. 2B (g)) at the side faces of the ridge 14 was about 150 nm, and the width X above the nitride semiconductor layer on both sides of the ridge 14 was about 400 nm.

Electrodes (27b and 28) were formed from the top face of the ridge 14 to part of the nitride semiconductor layer on both sides of the ridge 14. The electrodes 27b were formed by laminating a nickel film (with a thickness of about 10 nm, for example) and a gold film (with a thickness of about 100 nm, for example) in that order, and were split by the voids 26b at a portion of the side faces of the ridge 14. The electrode 28 was formed by a platinum film (with a thickness of about 100 nm, for example). A p-side pad electrode 20 was formed over these electrodes (27b and 28).

A second protective film 19 was formed on the exposed surface of the n-side semiconductor layer 11 and the side faces of the nitride semiconductor layer.

An n-side electrode 21 was further formed on the back face of the substrate 10.

With this semiconductor laser chip, the electrodes were wire bonded, and laser oscillation was performed at room temperature. As a comparative example, everything was basically the same as in the semiconductor laser manufacturing method discussed below, but the laser element was formed so that no voids were introduced, and the electrodes were wire bonded and laser oscillation was performed at room temperature in the same manner.

As a result, it was confirmed that with the laser element in this Example, compared to one having no voids, the drive current decreased by about 15%, and stable operating current and operating voltage were exhibited over an extended period.

Also, laser light absorption by the electrodes disposed above was reduced over the direction in which the ridge extended, and light could be emitted more efficiently.

Example 2

Method for Manufacturing Nitride Semiconductor Laser Element

The laser element of Example 1 can be manufactured by the following method.

(a) Formation of Nitride Semiconductor Layer

First, a substrate 1 composed of n-type GaN was placed in an MOVPE reaction vessel, and an n-type clad layer composed of silicon-doped $Al_{0.33}Ga_{0.67}N$ was grown using trimethylaluminum (TMA), trimethylgallium (TMG), ammonia (NH$_3$) and silane gas (SiH$_4$; used as an impurity gas). Then, an n-side light guide layer composed of undoped GaN was grown using TMG and ammonia.

Next, a barrier layer composed of silicon-doped In$_{0.02}$Ga$_{0.98}$N was grown using trimethylindium (TMI), TMG, ammonia, and silane gas. The silane gas was halted, and a well layer composed of undoped In$_{0.06}$Ga$_{0.94}$N was grown using TMI, TMG, and ammonia. This was repeated twice, after which a barrier layer composed of In$_{0.02}$Ga$_{0.98}$N was grown using TMI, TMG, and ammonia, to grow an active layer (refractive index of approximately 2.5) composed of two pairs of multiple quantum wells (MQW). The TMI was halted, biscyclopentadienyl magnesium (Cp$_2$Mg) was introduced using TMA, TMG, and ammonia, and a p-type cap layer composed of magnesium-doped p-type Al$_{0.30}$Ga$_{0.70}$N was grown.

Then, the Cp$_2$Mg and TMA were halted, and a p-side light guide layer composed of undoped GaN was grown. Then, a p-side clad layer composed of a superlattice layer with a total thickness of 0.6 µm and consisting of a layer (2.5 nm) composed of undoped Al$_{0.05}$Ga$_{0.95}$N and a layer (2.5 µm) composed of magnesium-doped GaN was grown. Finally, Cp$_2$Mg was allowed to flow over this using TMG and ammonia, and a p-type contact layer (15 nm) composed of magnesium-doped p-type GaN.

(b) Formation of Ridge

A nitride semiconductor layer was laminated on a substrate, the resulting wafer was taken out of the reaction vessel, and a mask pattern composed of SiO$_2$ and in the form of a stripe 2 µm wide was formed on the surface of the uppermost p-side contact layer.

After this, etching was performed by RIE down to near the boundary between the p-side clad layer and the p-side light guide layer, and the ridge 14 was formed in the form of a stripe. At the same time, the nitride semiconductor layer was etched by RIE, and part of the surface of the n-side clad layer was exposed, for example.

(c) Formation of First Protective Film

Next, the first protective film 25 composed of a single layer of ZrO$_2$ was formed using an ECR sputtering apparatus on the surface of the nitride semiconductor layer, while the mask pattern was still in place. This first protective film 25 was formed in a thickness of 200 nm. The extent to which the first protective film is removed in the following step can be adjusted by varying the film formation conditions here.

(d) Removal of First Protective Film

The first protective film 25 formed on the p-side contact layer was removed by lift-off along with the mask pattern composed of SiO$_2$. The removal of the first protective film 25 can be accomplished by wet etching with BHF, for example, and the first protective film 25 can also be removed from a part of the side faces of the ridge 14 by adjusting the etching time, adjusting the BHF concentration, etc.

(e) Lamination of Conductive Layer

Next, as shown in FIG. 4A (a), a conductive layer 40 composed of a nickel film and a conductive layer 41 composed of a gold film were laminated by sputtering over the p-side contact layer including the ridge 14. Over this, as shown in FIG. 4A (b), a mask pattern 42 having an opening in the region corresponding to the p-side electrode was formed by resist in photolithography and etching steps.

After this, as shown in FIG. 4A (c), a conductive layer 43 composed of a platinum film was formed by sputtering over the conductive layers 40 and 41 including the mask pattern 42, and the conductive layer 43 composed of a platinum film was patterned by lift-off (see FIG. 4A (d)).

Although not shown in the drawings, a mask pattern having openings at the parts of the conductive layer 43 composed of a platinum film corresponding to the shoulders of the ridge 14 was formed, this mask pattern was used as a mask to perform wet etching for a relatively short time with aqua regia, which introduced gaps 22 (see FIG. 5 (a)) into the conductive layer 43 corresponding to the shoulders of the ridge 14. These gaps 22 can be suitably introduced by adjusting the aqua regia concentration, the etching time, and other such factors. Here, the shape of the mask pattern may be varied so as to introduce gaps 23 (see FIG. 5 (b)) into the conductive layer 43 corresponding to the base portion of the ridge 14, or gaps may be introduced into the conductive layer 43 corresponding to both the base portion and the shoulders of the ridge.

Then, as shown in FIG. 4A (e), the conductive layer 41 composed of a gold film was patterned by wet etching using an iodine-potassium iodide solution as an etchant and using the conductive layer 43 composed of a platinum film as a mask. Here, the conductive layer 41 composed of a gold film was also removed at the locations corresponding to the base portion from the shoulders of the ridge 14, via the previously introduced gaps of the conductive layer 43, and voids were introduced at these locations.

As shown in FIG. 4A (f), a mask pattern 44 that covers the conductive layer 43 composed of a platinum film was formed by resist in photolithography and etching steps.

The conductive layer 40 composed of a nickel film was patterned by wet etching using this mask pattern 44 as a mask and using a hydrochloric acid-based solution composed of a mixture of hydrochloric acid and acetic acid as the etchant, and an electrode was formed. The mask pattern 44 here was formed so that the conductive layer 40 formed on the top face of the ridge via the previously introduced gaps of the conductive layer 43 was not removed. Consequently, the conductive layer 40 composed of a nickel film remained at the top face of the ridge covered by the mask pattern 44, the side faces of the ridge, and the lower part of the voids, and the nickel film was removed at the locations exposed from the mask pattern 44.

After this, a p-side pad electrode that was electrically connected with the p-side electrode was formed on the electrode.

After these steps, annealing was performed at about 500° C. under an oxygen atmosphere in order to ensure good ohmic properties. Consequently, some or all of the conductive layer 40 composed of a nickel film adjacent to the voids 26b may be unevenly distributed, and there may be locations where this layer is disposed in the form of islands on the first protective film 25. Also, the conductive layer 40 composed of a nickel film and the conductive layer 41 composed of gold may become alloyed, so that they are partially or entirely disposed as a single-layer structure.

This annealing step to ensure ohmic properties may be performed at any stage, and it may be performed before the removal of the conductive layer composed of a nickel film by wet etching. The conductive layer composed of a nickel film and the conductive layer composed of a gold film is alloyed by this annealing. Thus obtained alloyed conductive layer is not removed by above described etchant. On the other hand, the conductive layer composed of a nickel film which is not alloyed under the voids 26b can be removed by the etchant after annealing. Therefore, by performing an annealing before wet etching, the conductive layer composed of a nickel film which is positioned under the voids 26b can be selectively removed without removal of the conductive layer composed of a nickel film before annealing from a location where the ohmic contact is desired.

After this, an n-side electrode was formed on the rear face of the n-type GaN substrate.

After the p- and n-electrodes had thus been formed, the GaN was cleaved at the M plane of the GaN substrate (the plane corresponding to the side face of a hexagonal column when the nitride semiconductor is expressed as a hexagonal column) to separate the wafer into bars, and cavity planes were produced at the cleaved faces of these bars. After this, the bars were cut into chips in a direction perpendicular to the cavity plane.

It has been confirmed that the above-mentioned alloying, deformation, and uneven distribution of the composed of a nickel film has substantially no effect on laser light absorption or light emission efficiency or on ensuring stable operating current and operating voltage and good drive current in the obtained laser element, and the same effect is obtained as with the laser element of Example 1.

Example 3

Method for Manufacturing Nitride Semiconductor Laser Element

The laser element of Example 1 can also be manufactured by the following method.

Everything from the formation of the nitride semiconductor layer in step (a) to the removal of the first protective film in step (d) was carried out in the same manner as in Example 2.

With the manufacturing method of this Example, the removal of the first protective film in step (d) forms a stepped portion on the side faces of the ridge, and this stepped portion is utilized in step (e) to laminate the conductive layer and form an electrode. With the electrode formed here, gaps are introduced in a portion of the conductive layer 43, which is attributable to the stepped portion of the side faces of the ridge.

(e) Lamination of Conductive Layer

As shown in FIG. 6 (*a*), a mask pattern 52 having an opening in the region where the p-side electrode was formed was formed on the nitride semiconductor layer on which the first protective film 25 was formed.

As shown in FIG. 6 (*b*), a conductive layer 50 composed of a nickel film, a conductive layer 51 composed of a gold film, and a conductive layer 53 composed of a platinum film were each formed and sputtering and laminated over the nitride semiconductor layer including this mask pattern 52.

As shown in FIG. 6 (*c*), this was patterned by lift-off, and an electrode was formed. Here, the above-mentioned stepped portion on the ridge side faces was utilized to introduce gaps into the shoulders of the conductive layer 53.

After this, although not depicted, the conductive layer 51 composed of a gold film was etched by wet etching using an iodine-potassium iodide solution as the etchant. Consequently, the conductive layer 51 composed of a gold film was also removed from the locations corresponding to the shoulders of the ridge 14, via the previously introduced gaps in the conductive layer 53, and voids were introduced at these locations.

After this, a semiconductor laser element was formed in the same manner as in Example 2. The resulting laser element gives the same effects as the laser element of Example 1.

Example 4

Method for Manufacturing Nitride Semiconductor Laser Element

The laser element of Example 1 can be manufactured by the following method.

Everything from the formation of the nitride semiconductor layer in step (a) to the removal of the first protective film in step (d) was carried out in the same manner as in Example 2.

(e) Lamination of Conductive Layer

Figure 4B:
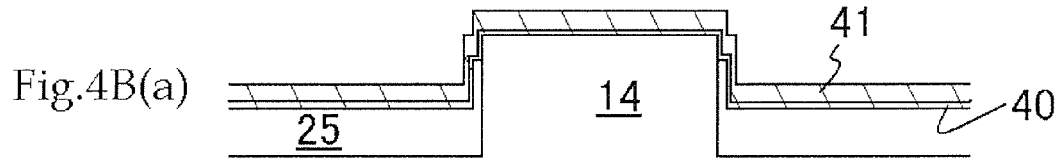
FIG. 4B is a schematic cross-sectional view describing a manufacturing method of another nitride semiconductor laser element manufactured by the present invention.
Figure 4B:
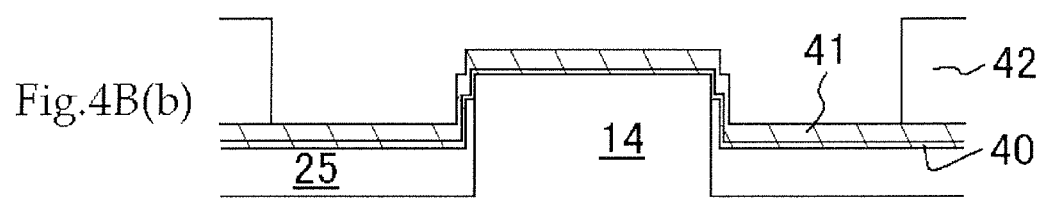
Figure 4B:
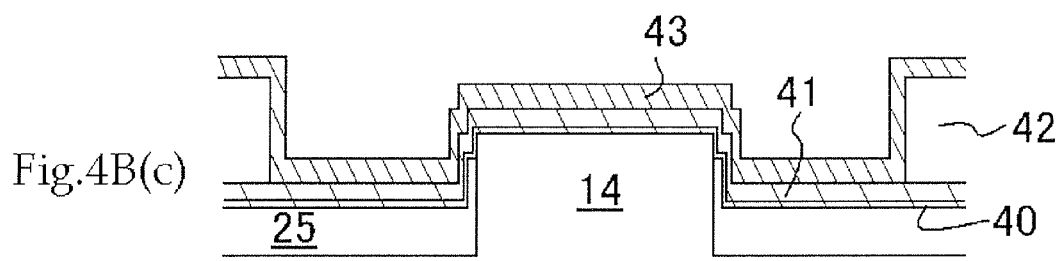
Figure 4B:
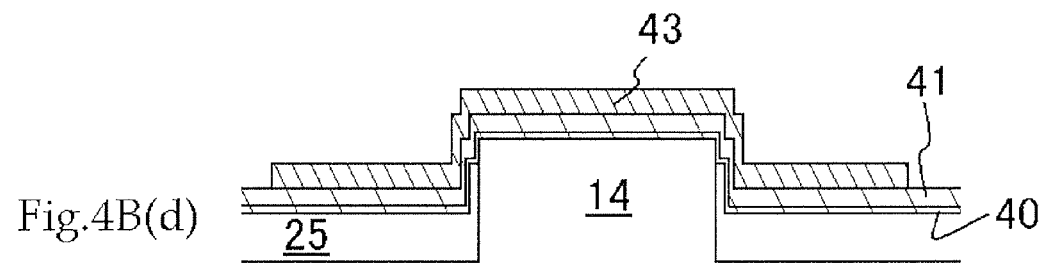
Figure 4B:
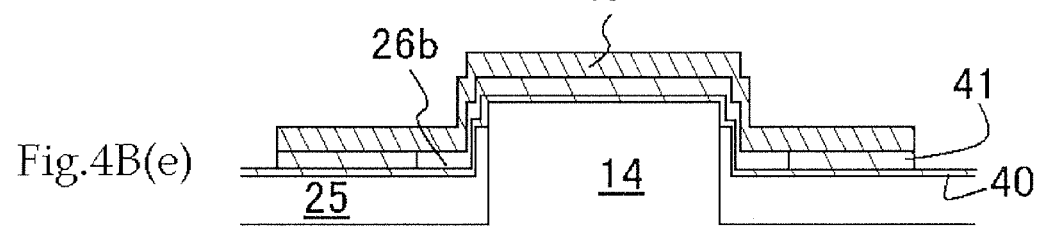
Figure 4B:
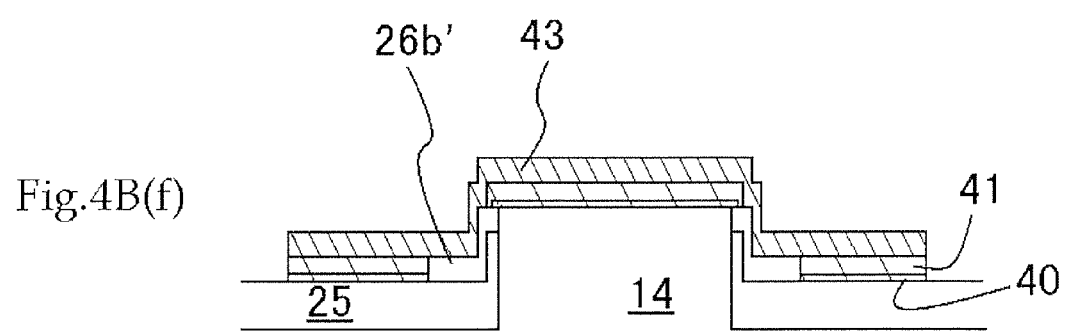
Figure 7A:
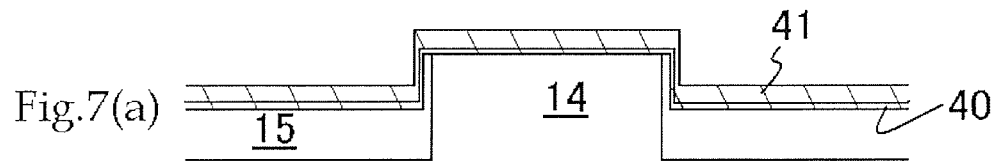
FIG. 7 is a schematic cross-sectional view describing a manufacturing method of another nitride semiconductor laser element of the present invention.
Figure 7B:
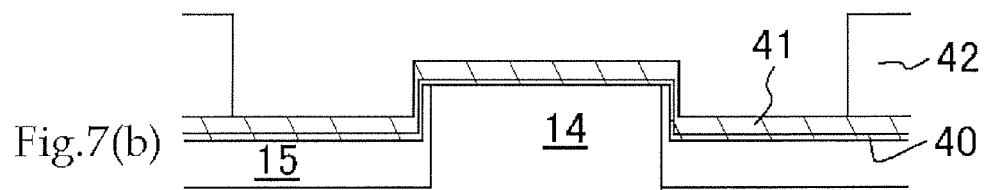
Figure 7C:
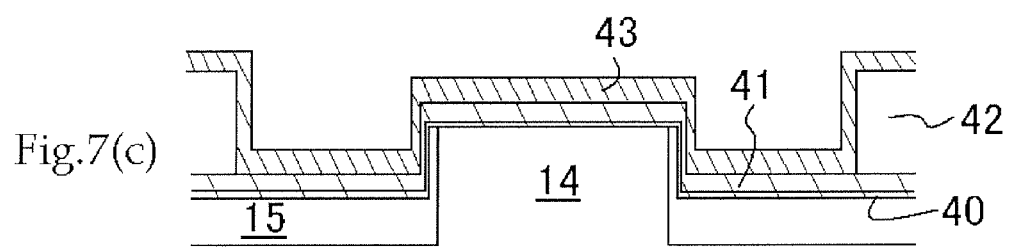
Figure 7D:
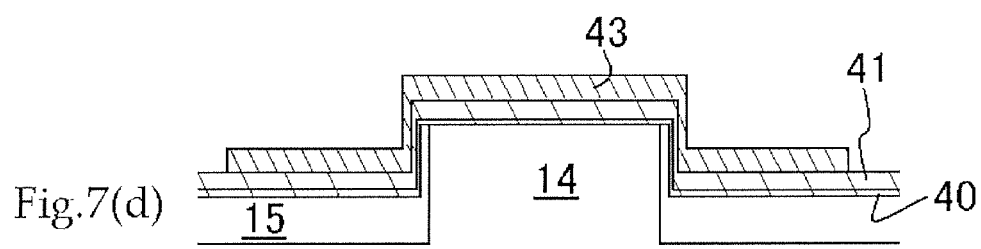
Figure 7E:
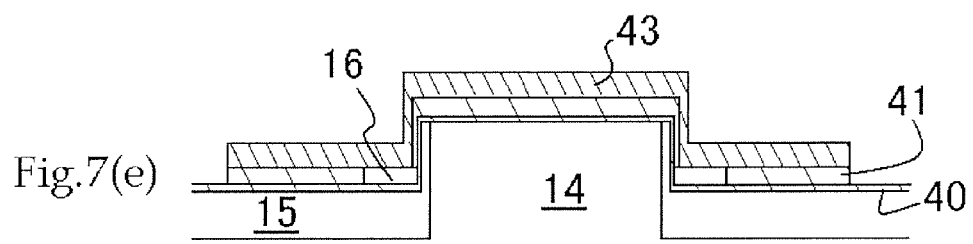
Figure 7F:
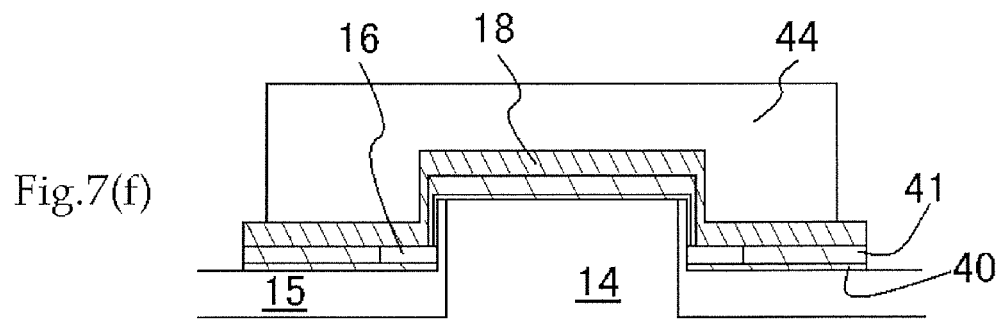

Next, just as in Example 2, as shown in FIG. 4B (a), the conductive layer 40 composed of a nickel film and the conductive layer 41 composed of a gold film were laminated by sputtering over the p-side contact layer including the ridge 14. Over this, as shown in FIG. 4B (b), the mask pattern 42 having an opening in the region corresponding to the p-side electrode was formed by resist in photolithography and etching steps.

After this, as shown in FIG. 4B (c), a conductive layer 43 composed of a platinum film was formed by sputtering over the conductive layers 40 and 41 including the mask pattern 42, and the conductive layer 43 composed of a platinum film was patterned by lift-off (see FIG. 4B (d)).

After this, just as in Example 2, the mask pattern was utilized to introduce gaps into the conductive layer 43.

Then, as shown in FIG. 4B (e), the conductive layer 41 composed of a gold film was patterned by wet etching using an iodine-potassium iodide solution as an etchant and using the conductive layer 43 as a mask. Here, the conductive layer 41 composed of a gold film was also removed at the locations corresponding to the base portion from the shoulders of the ridge 14, via the previously introduced gaps of the conductive layer 43, and the voids 26b were introduced at these locations.

Then, as shown in FIG. 4B (f), the conductive layer 40 composed of a nickel film was patterned using the conductive layer 43 and the conductive layer 41 composed of a gold film as masks, by wet etching using a hydrochloric acid-based solution composed of a mixture of hydrochloric acid and acetic acid as an etchant, and an electrode was formed. Here, the conductive layer 40 composed of a nickel film adjacent to the voids 26b was also removed, via the previously introduced gaps in the conductive layer 43 and the voids 26b at the locations corresponding to the base portion from the shoulders of the ridge 14, and voids 26b' were ensured at these locations.

After this, a semiconductor laser element was formed in the same manner as in Example 2.

With a manufacturing method such as this, the above-mentioned conductive layer composed of a nickel film is alloyed with the adjacent conductive layer 41 composed of a gold film as a result of annealing. The laser element thus obtained gives the same effects as the laser element in Example 1.

Example 5

For Manufacturing Nitride Semiconductor Laser Element

The laser element of Example 1 can also be manufactured by the following method.

Everything from the formation of the nitride semiconductor layer in step (a) to the removal of the first protective film in step (d) was carried out in the same manner as in Example 2.

With the manufacturing method of this Example, the removal of the first protective film in step (d) forms a stepped portion on the side faces of the ridge, and this stepped portion was utilized in step (e) to laminate the conductive layer and form an electrode. With the electrode formed here, gaps are introduced in a portion of the conductive layer 43, which is attributable to the stepped portion of the side faces of the ridge.

After this, just as in Example 2, the conductive layer 41 composed of a gold film was patterned using as a mask the conductive layer 43 into which gaps were introduced, and part of the conductive layer 41 composed of a gold film was removed from locations corresponding to the base portion from the shoulders of the ridge 14, so that voids were formed at these locations.

Then, as shown in FIG. 4A (f), the mask pattern 44 that covers the conductive layer 43 composed of a platinum film was formed by resist in photolithography and etching steps.

This mask pattern 44 was used to perform wet etching using a hydrochloric acid-based solution composed of a mixture of hydrochloric acid and acetic acid as the etchant, thereby patterning the conductive layer 40 composed of a nickel film and forming an electrode. The mask pattern 44 here was formed such that the conductive layer 40 formed on the top face of the ridge via the previously introduced gaps of the conductive layer 43 was not removed. Consequently, the conductive layer 40 composed of a nickel film remained at the lower part of the voids, on the side faces of the ridge, and on the top face of the ridge covered by the mask pattern 44, and the nickel film was removed from locations exposed from the mask pattern 44.

After this, a semiconductor laser element was formed in the same manner as in Example 2.

Example 6

Method for Manufacturing Nitride Semiconductor Laser Element

With the method for manufacturing a laser element in this Example, in the introduction of gaps into the conductive layer 43 composed of a platinum film corresponding to the shoulders of the ridge in the lamination of the conductive layer in step (e) in Example 2, the manufacture was substantially the same as in Example 2, except that no mask pattern was formed, conditions were set such that the conductive layer 43 corresponding to the shoulders of the ridge would be sputtered in a concentrated fashion, and the conductive layer 43 was etched back, thereby introducing gaps into the conductive layer 43. The laser element thus obtained gave the same effects as the laser element in Example 1.

Examples of the concentrated sputtering here include sputtering with argon, and sputtering with a gas obtained by mixing argon with chlorine, nitrogen, or the like.

Example 7

Nitride Semiconductor Laser Element

Figure 1B:
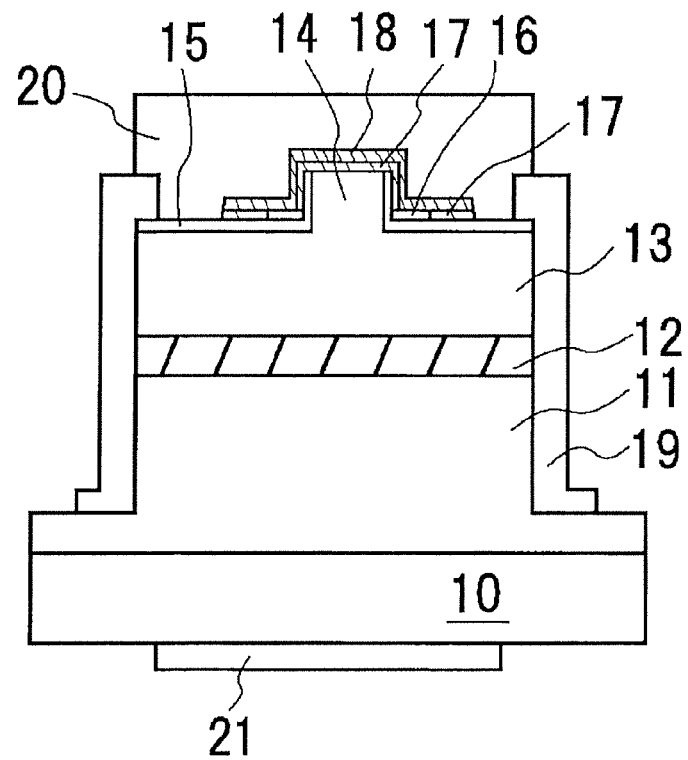
FIG. 1B is a schematic cross-sectional view describing a structure of another nitride semiconductor laser element manufactured by the present invention.

As shown in FIG. 1B, the laser element in this Example oscillates at a band of 500 nm or less, and has the same laminated structure of nitride semiconductor layers and the ridge 14 as in Example 1.

A first protective film 15 composed of $ZrO_2$ was formed on the surface of the p-side semiconductor layer, except for the top face of the ridge 14.

Voids 16 were disposed via the first protective film 15 at positions corresponding to the base portion of the ridge 14. The width of these voids 16 (X in FIG. 2A (a)) was 400 nm and the height H was about 110 nm, for example.

Electrodes (17 and 18) were formed from the top face of the ridge 14 to part of the nitride semiconductor layer on both sides of the ridge 14. The electrodes (17 and 18) have the same laminated structure as in Example 1, and a p-side pad electrode 20 was formed over these electrodes (17 and 18).

A second protective film 19 was formed on the exposed surface of the n-side semiconductor layer 11 and the side faces of the nitride semiconductor layer.

Further, an n-side electrode 21 was formed on the rear face of the substrate 10.

The nitride semiconductor laser element having voids such as these has the same effects as those in Example 1.

That is, laser light absorption by the electrodes disposed thereon can be reduced over the direction in which the ridge extends, the drive current decreases by about 15%, and stable operating current and operating voltage are exhibited over an extended period.

Example 8

Method for Manufacturing Nitride Semiconductor Laser Element

The laser element of Example 7 can be manufactured by the following method.

The conditions for forming a first protective film were controlled so that, as shown in FIG. 7 (a), a first protective film 15 that exposed the ridge top face was formed in substantially the same manner as in Example 2, and a conductive layer 40 composed of a nickel film and a conductive layer 41 composed of a gold film were formed in substantially the same manner as in Example 2. A mask pattern 42 was formed over this as shown in FIG. 7 (b).

After this, as shown in FIG. 7 (c), a conductive layer 43 composed of a platinum film was formed, and the conductive layer 43 was patterned by lift-off (see FIG. 7 (d)).

Although not shown in the drawings, gaps 23 were introduced as shown in FIG. 5 (b) at positions of the conductive layer 43 corresponding to the base portion of the ridge 14 by forming a mask having openings at locations corresponding to the base portion of the ridge 14.

Then, as shown in FIG. 7 (e), the conductive layer 41 composed of a gold film was patterned using the conductive layer 43 as a mask and using an iodine-potassium iodide solution as an etchant. Here, part of the conductive layer 41 composed of a gold film was also removed at the locations corresponding to the base portion of the ridge 14, via the previously introduced gaps of the conductive layer 43, and voids were introduced at these locations.

After this, as shown in FIG. 7 (f), a mask pattern 44 was formed that covered the conductive layer 43 composed of a platinum film.

The conductive layer 40 composed of a nickel film was patterned by wet etching using this mask pattern 44 as a mask and using a hydrochloric acid-based solution composed of a mixture of hydrochloric acid and acetic acid as the etchant, and an electrode was formed. The mask pattern 44 here was formed so that the conductive layer 40 formed on the top face of the ridge via the previously introduced gaps of the conductive layer 43 was not removed. Consequently, the conductive layer 40 composed of a nickel film remained at the top face of the ridge covered by the mask pattern 44, the side faces of the ridge, and the lower part of the voids, and the nickel film was removed at the locations exposed from the mask pattern 44.

After this, a semiconductor laser element was formed in the same manner as in Example 2. The laser element thus obtained gave the same effects as the laser element in Example 1.

Again with this manufacturing method, after annealing is performed in order to ensure good ohmic properties, some or all of the conductive layer 40 composed of a nickel film adjacent to the voids 26b may be unevenly distributed, and there may be locations where this layer is disposed in the form of islands on the first protective film 25. Also, the conductive layer 40 composed of a nickel film and the conductive layer 41 composed of gold may become alloyed, so that they are partially or entirely disposed as a single-layer structure, and there may be situations in which an electrode structure such as that shown in FIG. 1A can be adopted.

Example 9

Nitride Semiconductor Laser Element and Manufacturing Method

In this Example, substantially the steps (a) through (c) of Example 2 are performed, and in the removal of the first protective film in step (d), voids corresponding to second voids 16aa in FIG. 2B (h) can be formed, for example. Otherwise, a semiconductor laser element was formed in substantially the same manner as in Example 2. The laser element thus obtained gave the same effects as the laser element in Example 1.

The nitride semiconductor laser element of the present invention can be used in optical disk applications, optical communication systems, printers, exposure applications, measurement, and so forth. It can also be used in biological-related excitation light sources and the like with which the presence or location of a substance having sensitivity at a specific wavelength can be detected by irradiating the substance with light obtained from a nitride semiconductor laser.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a nitride semiconductor laser element comprising:
   (a) forming a nitride semiconductor layer on a substrate;
   (b) forming a ridge on a surface of the nitride semiconductor;
   (c) forming a first protective film on the nitride semiconductor layer including the ridge;
   (d) removing the first protective film from at least a top face of the ridge;
   (e) forming a conductive layer composed of a two or more of multilayer film with different compositions on the first protective film and the nitride semiconductor layer including the ridge, and introducing a plurality of gaps at locations of at least at the uppermost conductive layer corresponding to the base portion from the ridge shoulders; and
   (f) removing part of the lowermost layer of the conductive layer, which is located on a part of the first protective film formed on a side face of the ridge, through the gaps to form a void defined by the first protective film and the conductive layer so that at least a part of a surface of the first protective film extending substantially parallel to the side face of the ridge is exposed to the void.

2. The method for manufacturing a nitride semiconductor laser element according to claim 1, wherein
   the forming the conductive layer includes forming a first conductive layer and a second conductive layer which has a different etching rate from the first conductive layer and is disposed on the first conductive layer.

3. The method for manufacturing a nitride semiconductor laser element according to claim 2, wherein
   the forming the conductive layer further includes forming a third conductive layer which has a different etching rate from the first conductive layer and the second conductive layer, and is disposed under the first conductive layer;
   after the step (f), further forming a mask pattern on part of the nitride semiconductor layer, and the upper face and the side faces of the ridge to remove part of the third conductive layer using the mask pattern.

4. The method for manufacturing a nitride semiconductor laser element according to claim 2, wherein
   the forming the conductive layer further includes forming a third conductive layer which has a different etching rate from the first conductive layer and the second conductive layer, and is located under the first conductive layer;
   in the step (f), further removing part of the first conductive layer to form the void;
   after the step (f), further forming a mask pattern on a part of the nitride semiconductor layer, and the upper face and the side faces of the ridge to remove parts of the first conductive layer and the third conductive layer using the mask pattern.

5. The method for manufacturing a nitride semiconductor laser element according to claim 1, wherein
   the void is disposed from the ridge base portion to both sides of the ridge.

6. The method for manufacturing a nitride semiconductor laser element according to claim 1, wherein
   the first protective film is formed so that part of the ridge side faces is exposed; and
   the void is disposed from the ridge base portion to both sides of the ridge and in contact with both sides of the ridge.

7. The method for manufacturing a nitride semiconductor laser element according to claim 1, wherein
   the first protective film is formed from a material with a lower refractive index than that of the nitride semiconductor layer.

8. The method for manufacturing a nitride semiconductor laser element according to claim 1, wherein
   the void is disposed substantially parallel to the ridge in the direction of the ridge extended.

* * * * *